(12) United States Patent
Zhu et al.

(10) Patent No.: US 7,737,501 B2
(45) Date of Patent: Jun. 15, 2010

(54) FINFET SRAM WITH ASYMMETRIC GATE AND METHOD OF MANUFACTURE THEREOF

(75) Inventors: Huilong Zhu, Poughkeepsie, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 11/776,118

(22) Filed: Jul. 11, 2007

(65) Prior Publication Data

US 2009/0014798 A1  Jan. 15, 2009

(51) Int. Cl.
*H01L 29/94* (2006.01)
*H01L 21/336* (2006.01)

(52) U.S. Cl. ............... 257/365; 257/347; 257/E27.098; 438/286

(58) Field of Classification Search ............. 257/347, 257/365, E27.098; 438/286
See application file for complete search history.

(56) References Cited

U.S. PATENT DOCUMENTS

| 6,706,571 | B1 * | 3/2004 | Yu et al. ............... 438/157 |
| 6,909,147 | B2 | 6/2005 | Aller et al. |
| 2003/0151077 | A1 * | 8/2003 | Mathew et al. ............ 257/250 |
| 2003/0201458 | A1 * | 10/2003 | Clark et al. .............. 257/192 |
| 2004/0099885 | A1 * | 5/2004 | Yeo et al. ................ 257/208 |
| 2004/0222477 | A1 | 11/2004 | Aller et al. |
| 2006/0065831 | A1 | 3/2006 | Fukuyama et al. |
| 2006/0091463 | A1 | 5/2006 | Donze et al. |
| 2007/0257277 | A1 * | 11/2007 | Takeda et al. ............ 257/204 |
| 2008/0308850 | A1 * | 12/2008 | Berthold et al. ........... 257/288 |

OTHER PUBLICATIONS

Yang et al., "Fully Working 1.25μm2 6T-SRAM Cell with 45nm Gate Length Triple Gate Transistors," IEDM Tech. Dig., 2003, pp. 23-26.

* cited by examiner

*Primary Examiner*—Kiesha R Bryant
*Assistant Examiner*—Mark W Tornow
(74) *Attorney, Agent, or Firm*—Graham S. Jones; H. Daniel Schnurmann

(57) ABSTRACT

A FinFET SRAM transistor device includes transistors formed on fins with each transistor including a semiconductor channel region within a fin plus a source region and a drain region extending within the fin from opposite sides of the channel region with fin sidewalls having a gate dielectric formed thereon. Bilateral transistor gates extend from the gate dielectric. An asymmetrically doped FinFET transistor has source/drain regions doped with a first dopant type, but the asymmetrically doped FinFET transistor include at least one of the bilateral transistor gate electrode regions on one side of at least one of the fins counterdoped with respect to the first dopant type. The finFET transistors are connected in a six transistor SRAM circuit including two PFET pull-up transistors, two NFET pull down transistors and two NFET passgate transistors.

15 Claims, 27 Drawing Sheets

FINFET SRAM WITH ASYMMETRIC GATE AND METHOD OF MANUFACTURE THEREOF

BACKGROUND OF THE INVENTION

This invention relates to Field Effect Transistor (FET) Static Random Access Memory (SRAM) devices, and more particularly to finFET structures and methods of manufacture of finFET SRAM devices.

It is possible to change the length of finFET devices to reduce the on-current of a finFET device as exemplified in Yang et al., "Fully Working 1.25 mm$^2$ 6T-SRAM cell with 45 nm gate length Triple Gate Transistors," IEDM Tech. Dig., 2003, pp. 23-26. However, there is a problem in that devices with longer channel lengths not only require a larger portion of the silicon substrate area, but variables are introduced in terms of the variability of the physical dimensions of the gate lengths due to the complexities of optical proximity correction. In addition, different gate lengths give different short channel effect characteristics, which can cause threshold voltage mismatching or ratio variation induced by Vdd variation.

Another approach by Aller et al., in U.S. Patent Application Publication No. 2004/0222477 which issued as U.S. Pat. No. 6,909,147 discloses a finFET device provided with a first semiconductor fin and a second semiconductor fin with different heights. Adjustments of the ratio of the height of the first semiconductor fin to that of the second semiconductor fin are used to tune the performance of the transistor. However, the use of a thermal oxidation process to reduce the height of the fin requires that a hardmask be used in this process. Many processing steps are necessary such as deposition of a hardmask material, application and lithographic patterning of a photoresist, a transfer of a lithographic pattern into the hardmask, and thermal oxidation. The oxidation raises the surface level due to volume expansion caused by the oxidation, which causes lithographic variations or CD printing variations.

SUMMARY OF THE INVENTION

In accordance with this invention, a finFET (fin Field Effect Transistor) transistor device includes FinFET transistors comprising at least a first vertical fin formed on a substrate having bilateral sidewalls on opposite sides thereof with gate dielectric layers formed covering the bilateral sidewalls. A first channel region is formed in a fin juxtaposed with a first source region and a first drain region; a first set of bilateral doped gate electrodes is formed covering the gate dielectric layers proximate to the first channel region between the first source and drain regions, with the type of doping of the gate electrodes matching the type of doping of the first source and drain regions. A second channel region is formed in a vertical fin (which may be at another location on the same fin) juxtaposed with a second source region and a second drain region. A second set of bilateral doped gate electrodes is formed covering the gate dielectric layers proximate to the second channel region between the second source and drain regions, with the type of doping one of second set of bilateral gate electrodes counterdoped with respect to the type of doping of the second source and drain regions. Preferably the fins have substantially equal heights; the finFET transistors are connected in an SRAM circuit; the finFET transistors are connected in a six transistor SRAM circuit; and/or the finFET transistors are connected in a six transistor SRAM circuit including two PFET pull-up transistors, two NFET pull down transistors and two NFET pass-gate transistors.

In accordance with another aspect of this invention a transistor FinFET (fin Field Effect Transistor) Static Random Access Memory (SRAM) transistor device includes FinFET transistors. The finFET SRAM includes a plurality of transistors formed on an array of fins with each of the transistors including within one of the fins a semiconductor channel region plus a source region and a drain region extending from opposite sides of a the channel region. The fins have sidewalls with a gate dielectric layer formed thereon. Bilateral transistor gate electrode regions extend from the gate dielectric layer and the sidewalls of the fins juxtaposed with the channel regions. An asymmetrically doped FinFET transistor has source and drain regions doped with a first type of dopant, but the asymmetrically doped FinFET transistor include at least one of the bilateral transistor gate electrode regions on one side of at least one of the fins counterdoped with respect to the dopant of the source and drain regions of the asymmetrically doped finFET transistor. Preferably the fins have substantially equal heights; the finFET transistors are connected in an SRAM circuit; the finFET transistors are connected in a six transistor SRAM circuit; and/or the finFET transistors are connected in a six transistor SRAM circuit including two PFET pull-up transistors, two NFET pull down transistors and two NFET passgate transistors.

In accordance with yet another aspect of this invention, a method of forming a finFET (fin Field Effect Transistor) transistor device including FinFET transistors is provided. The method comprises the following steps. Form at least one first vertical fin on a substrate having bilateral sidewalls on opposite sides thereof with gate dielectric layers formed covering the bilateral sidewalls. Form a first channel region in a fin juxtaposed with a first source region and a first drain region and a first set of bilateral doped gate electrodes covering the gate dielectric layers proximate to the first channel region between the first source and drain regions, with the type of doping of the gate electrodes matching the type of doping of the first source and drain regions. Form a second channel region in the fin juxtaposed with a second source region and a second drain region; a second set of bilateral doped gate electrodes covering the gate dielectric layer proximate to the second channel region between the second source and drain regions, with the type of doping one of second set of bilateral gate electrodes counterdoped with respect to the type of doping of the second source and drain regions. Preferably the fins have substantially equal heights; the finFET transistors are connected in an SRAM circuit; the finFET transistors are connected in a six transistor SRAM circuit; and/or the finFET transistors are connected in a six transistor SRAM circuit including two PFET pull-up transistors, two NFET pull down transistors and two NFET passgate transistors.

In accordance with still another aspect of this invention a method is provided for forming a finFET (fin Field Effect Transistor) Static Random Access Memory (SRAM) transistor device comprises forming the finFET SRAM including a plurality of transistors on an array of fins with each of the transistors including within one of the fins a semiconductor channel region plus a source region and a drain region extending from opposite sides of a the channel region. Form gate dielectric layer on sidewalls of the fins. Form bilateral transistor gate electrode regions extending from the gate dielectric layer and the sidewalls of the fins juxtaposed with the channel regions. Form an asymmetrically doped finFET transistor having source and drain regions doped with a first type of dopant. Form the asymmetrically doped finFET transistor including at least one of the bilateral transistor gate electrode regions on one side of at least one of the fins counterdoped with respect to the dopant of the source and drain regions of the asymmetrically doped finFET transistor. Preferably the fins have substantially equal heights; the finFET transistors are connected in an SRAM circuit; the finFET transistors are connected in a six transistor SRAM circuit; and/or the finFET transistors are connected in a six transistor SRAM circuit including two PFET pull-up transistors, two NFET pull down transistors and two NFET passgate transistors.

The invention and objects and features thereof will be more readily apparent from the following detailed description and appended claims when taken with the drawings.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
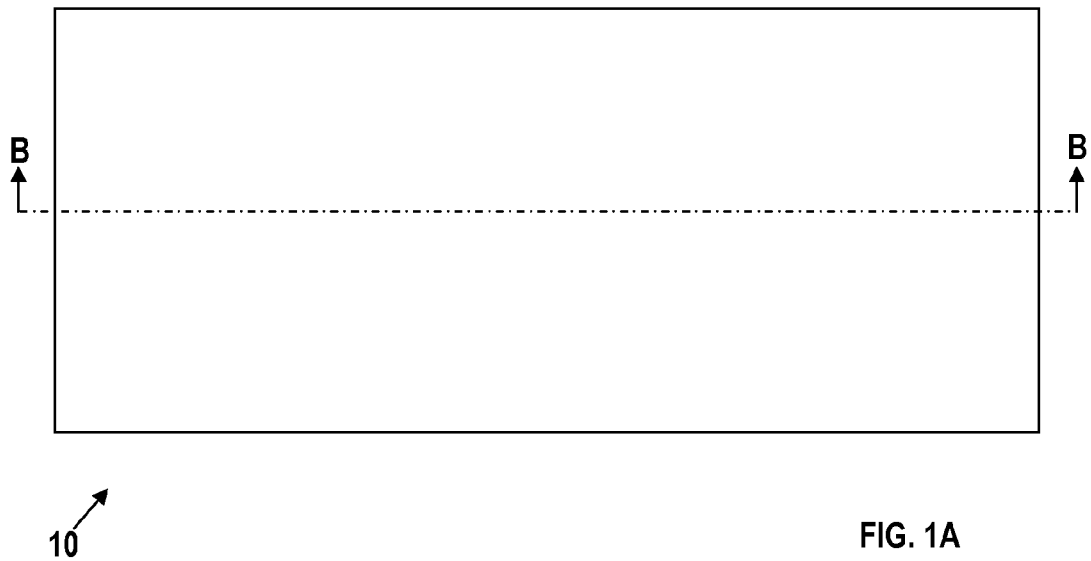
FIG. 1A shows a plan view of a multi-fin FinFET transistor device in accordance with this invention in an early stage of manufacture thereof after step 101 in FIG. 18A.
Figure 18A:
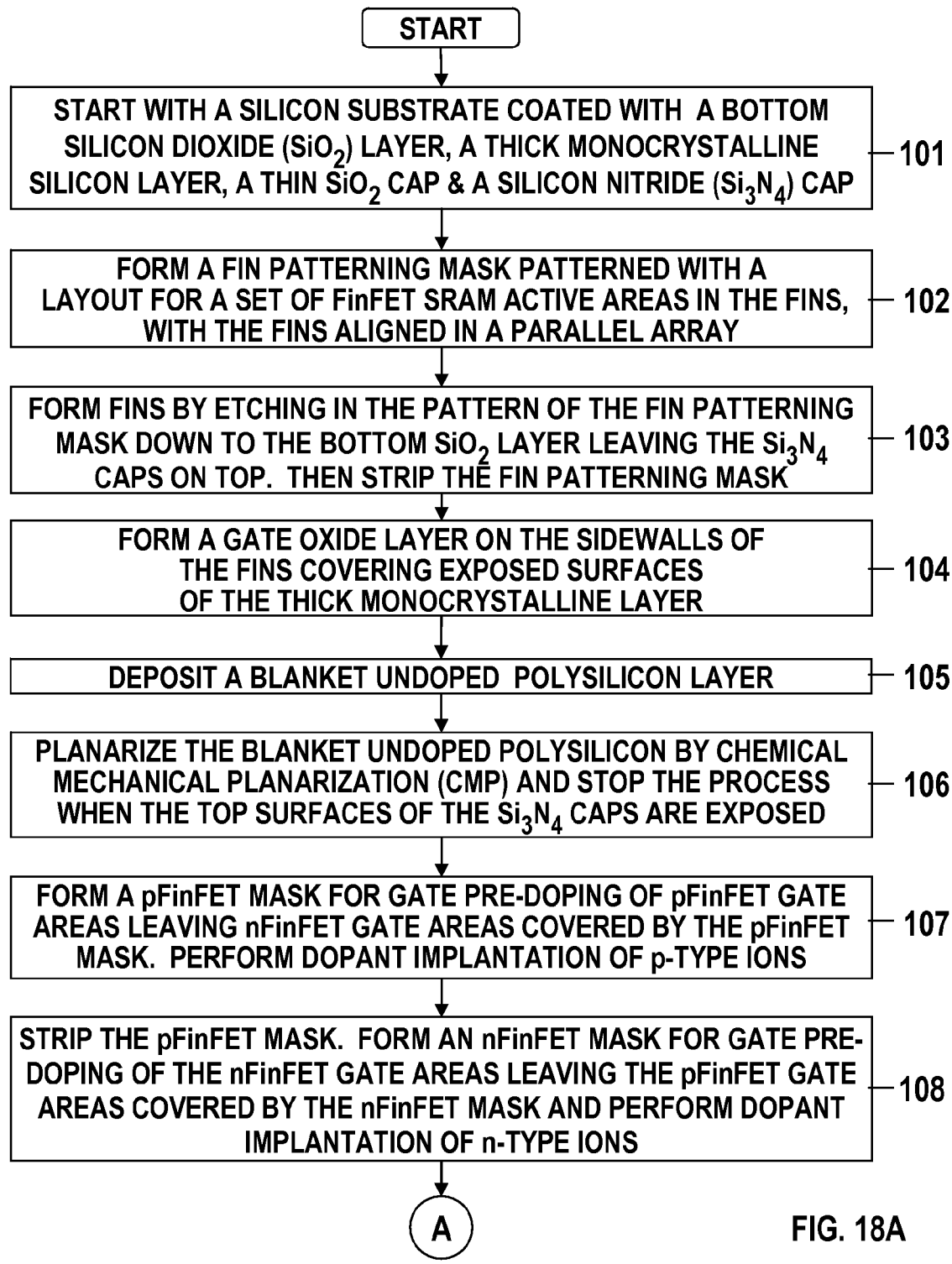
FIGS. 18A-18B comprise a flow chart of the method of manufacture of the device of FIGS. 15A-15D in accordance with this invention.

FIG. 1A shows a plan view of a multi-fin FinFET transistor device 10 in accordance with this invention in an early stage of manufacture thereof after step 101 in FIG. 18A.

Figure 1B:
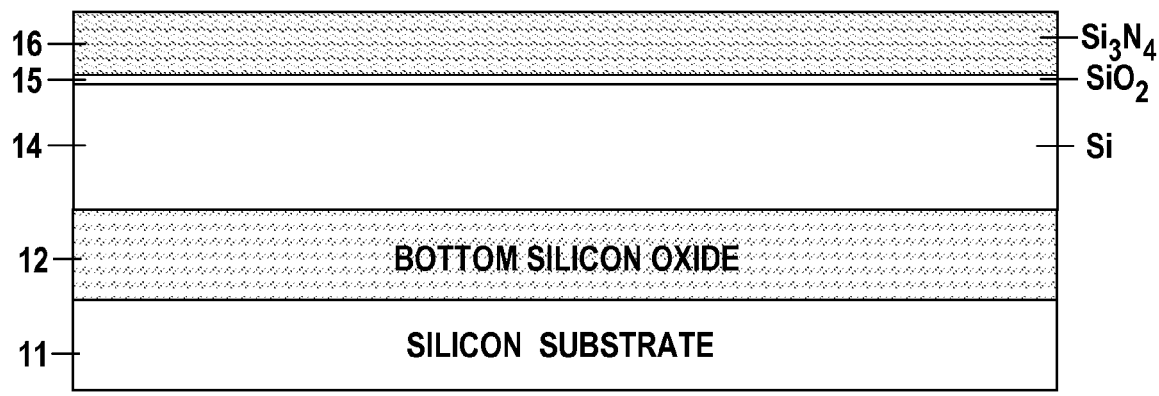
FIG. 1B is a sectional side-view of the device taken along section line B-B showing a flat planar, substrate on which a conformal, bottom $SiO_2$ layer is formed, covered in turn by a conformal, monocrystalline silicon fin layer, which is covered by a $SiO_2$ thin film cap which is covered by a conformal $Si_3N_4$ cap.

FIG. 1B is a sectional side-view of the device 10 taken along section line B-B in FIG. 1A formed within a portion of an integrated circuit chip showing the silicon substrate 10 which has a flat, planar top surface.

Step 101

Referring to FIG. 1B, a conformal, bottom silicon oxide layer 12 has been formed on the flat planar, top surface of the substrate 10. Then a conformal, flat, monocrystalline silicon fin layer 14 has been formed on the top surface of the bottom silicon dioxide ($SiO_2$) layer 12. Next, a conformal, flat, silicon dioxide ($SiO_2$) thin film cap 15 has been deposited on the top surface of the monocrystalline silicon fin layer 14. In turn a thicker layer, comprising a conformal, flat, silicon nitride ($Si_3N_4$) cap 16 has been deposited on the top surface of the silicon dioxide thin film cap 15.

Step 102

Figure 2A:
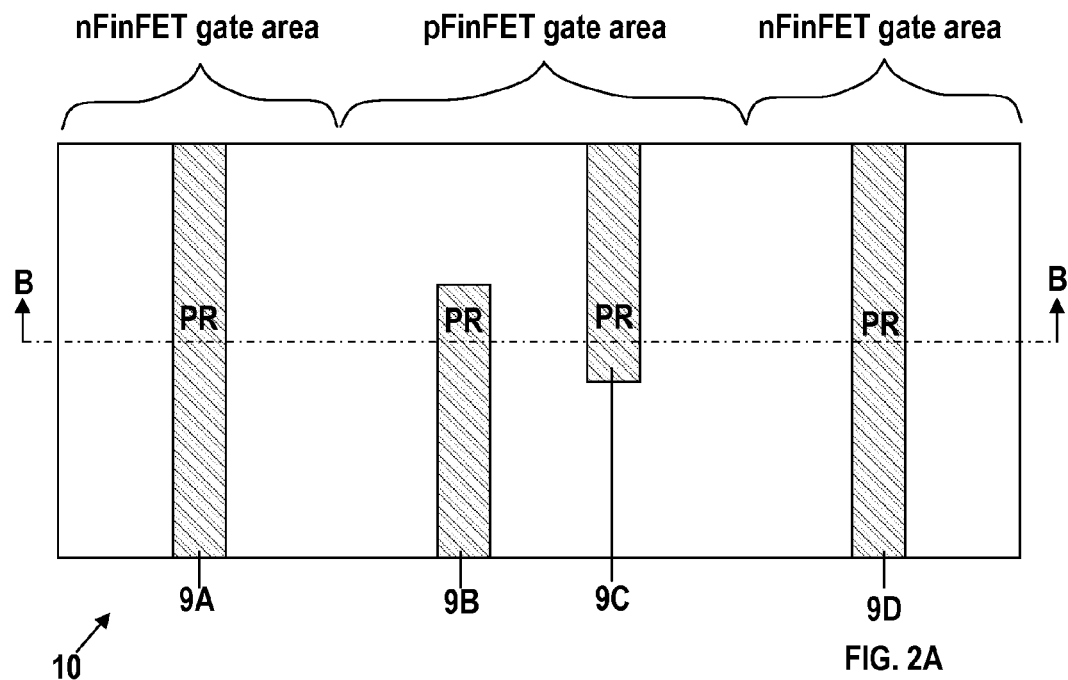
FIGS. 2A and 2B show the device of FIGS. 1A, 1B after step 102 in FIG. 18A in which a first mask with a set of fin patterned features has been formed over the top surface of the thicker, $Si_3N_4$ cap layer.
Figure 2B:
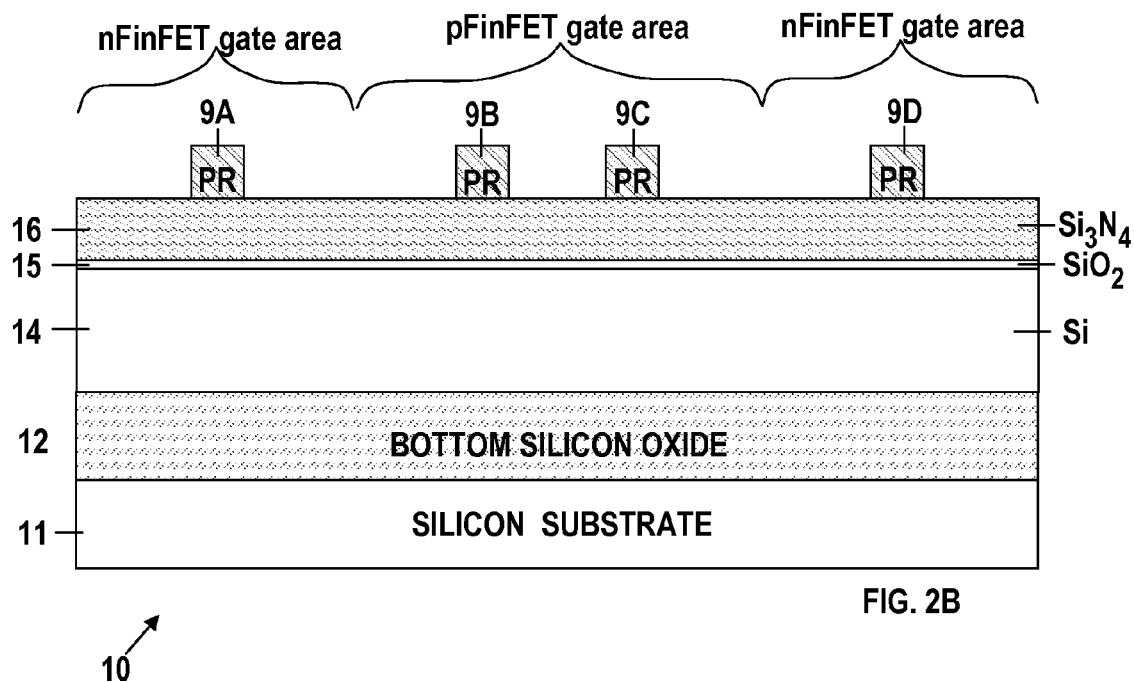

FIGS. 2A and 2B show the device 10 of FIGS. 1A, 1B after step 102 (FIG. 18A) in which a first photoresist (PR) mask 9 with a set of fin patterned features 9A-9D has been formed over the top surface of the thicker, conformal silicon nitride ($Si_3N_4$) cap layer 16. The mask 9 has been patterned with a layout for a set of FinFET SRAM active areas with the fin patterns 9A-9D aligned in a parallel array extending back into the page in FIG. 2B. The fin patterns 9A-9D are provided to produce the fin stacks 19A-19D shown in FIGS. 3A, 3B.

Step 103

Figure 3A:
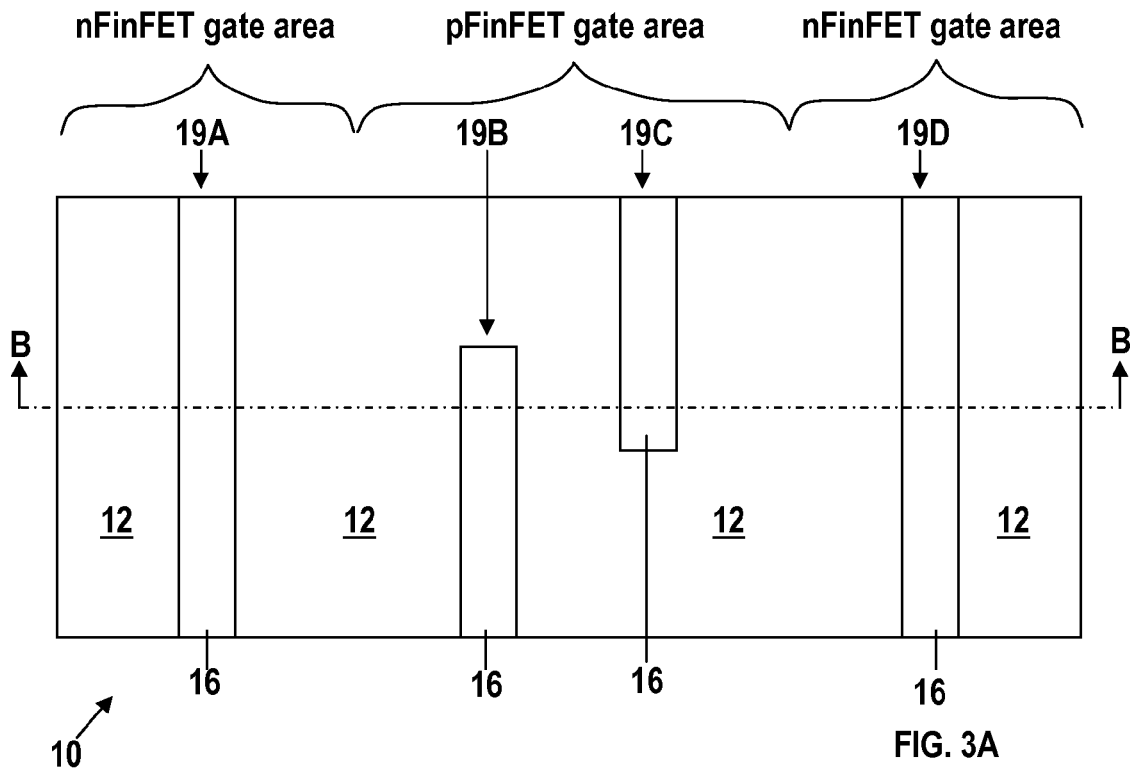
FIGS. 3A and 3B show the device of FIGS. 2A, 2B after formation of the fin stacks by etching aside from the fin patterned features of the first mask down to the top surface of the bottom silicon oxide layer in accordance with step 103 in FIG. 18A leaving the $Si_3N_4$ caps on top thereof.
Figure 3B:
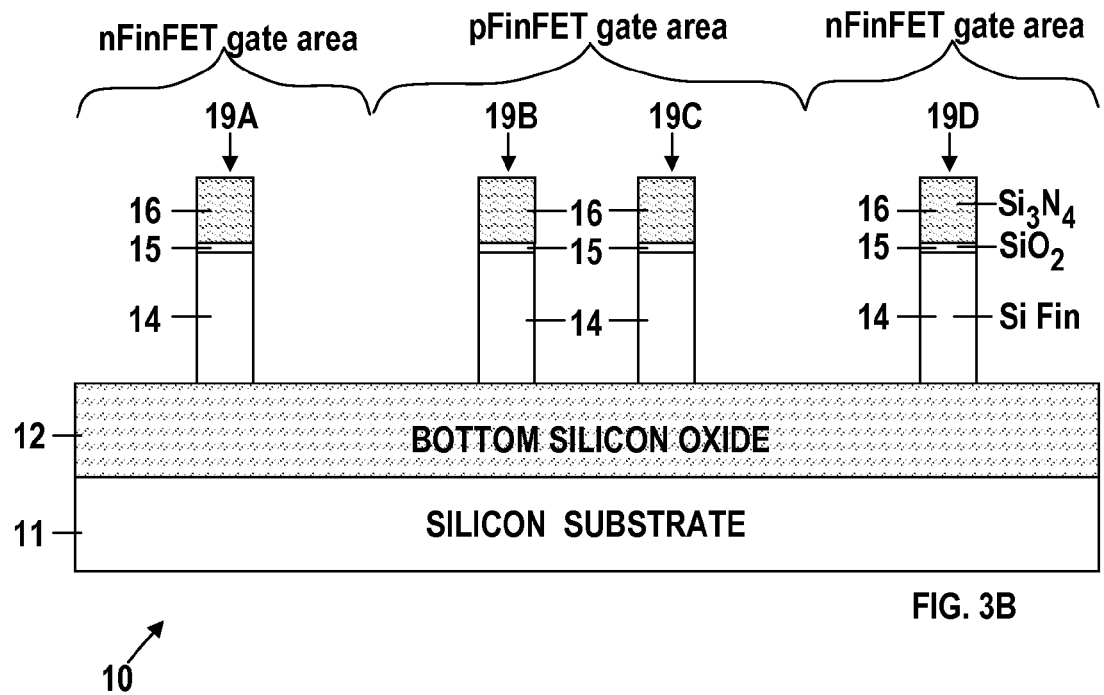

FIGS. 3A, 3B show the device 10 of FIGS. 2A, 2B after formation of the fin stacks 19A-19D by etching aside from the fin patterned features of the first photoresist mask 9 down to the top surface of the bottom silicon oxide layer 12 in accordance with step 103 leaving the Silicon Nitride ($Si_3N_4$) caps 16 on top thereof. Each of the fin stacks 19A-19D includes a silicon fin 14 on the bottom with a flat top surface. On top of the silicon fin is a silicon dioxide ($SiO_2$) thin film cap 15 in the middle and a thicker, conformal silicon nitride ($Si_3N_4$) cap 16 on top of the cap 15. Then after completion of the etching step, the first photoresist mask 9 was stripped. The silicon fins 14 will be the channels of six finFET devices which will be formed in subsequent steps. Each of the fins 14A-14D has a flat top surface and is of uniform height and of uniform width from the front end to the back end thereof in each of the fin stacks 19A-19D. The stacks 19A and 19D and fins 14A and 14D extend from front to back of the plan view shown in FIG. 3A, whereas the stack 19B and fin 14B extend from the front partially towards the back and the stack 19C and fin 14C extend from the back partially towards the front of FIG. 3A. Thus the fins 19A and 19D are shown to be equal in length and longer and from front to back than the fins 19B and 19C. The fins 19B and 19C are shown to be and equal in length from front to back but with a shorter length than the fins 19A and 19D.

Step 104

Figure 4A:
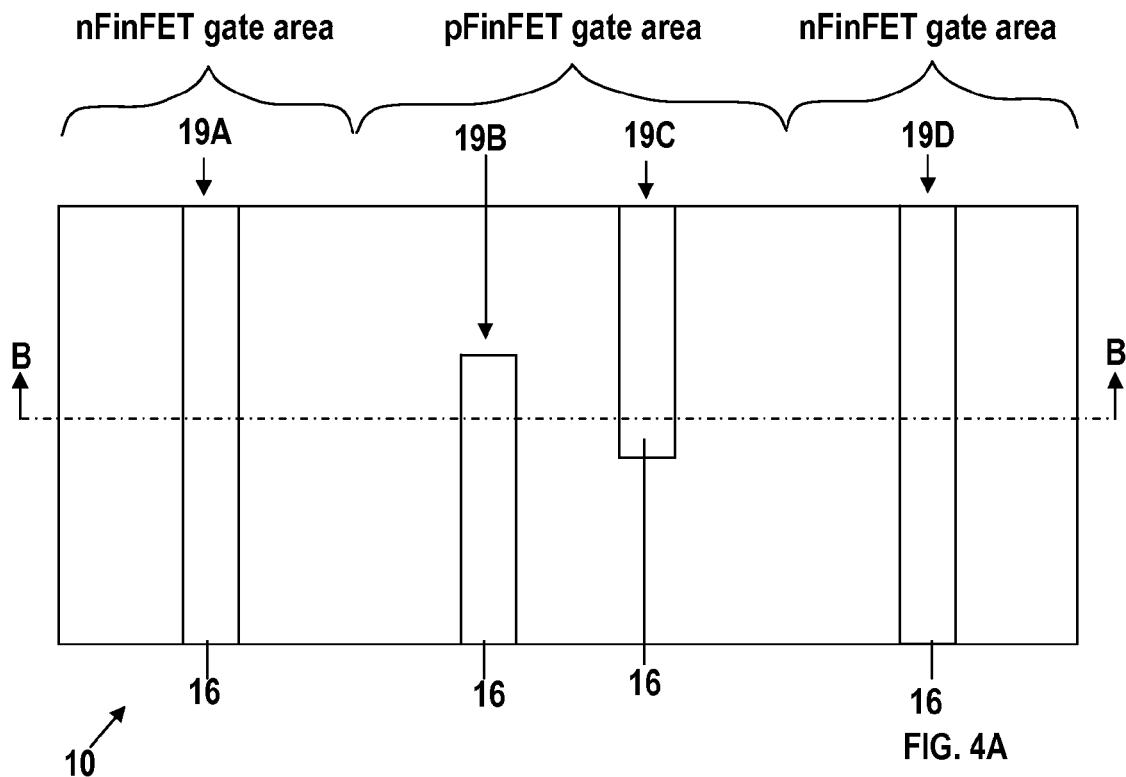
FIGS. 4A and 4B show the device of FIGS. 3A, 3B after formation of a gate dielectric layer preferably comprising a thin gate oxide layer on the sidewalls of the silicon fins of the fin stacks in accordance with step 104 in FIG. 18A covering exposed surfaces of the thick monocrystalline layer of the silicon fins.
Figure 4B:
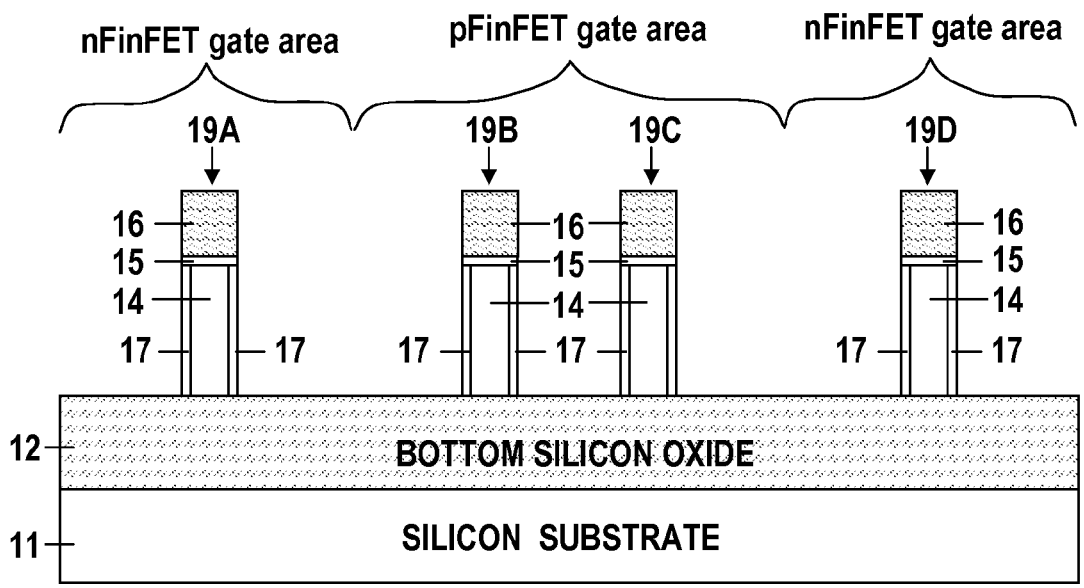

FIGS. 4A, 4B show the device 10 of FIGS. 3A, 3B after formation of a thin gate oxide layer 17 on the sidewalls of the silicon fins 14 of the fin stacks 19A, 19B, 19C and 19D in accordance with step 103 covering of exposed surfaces of the thick monocrystalline layer of the silicon fin stacks 19A-19D.

Step 105

Figure 5A:
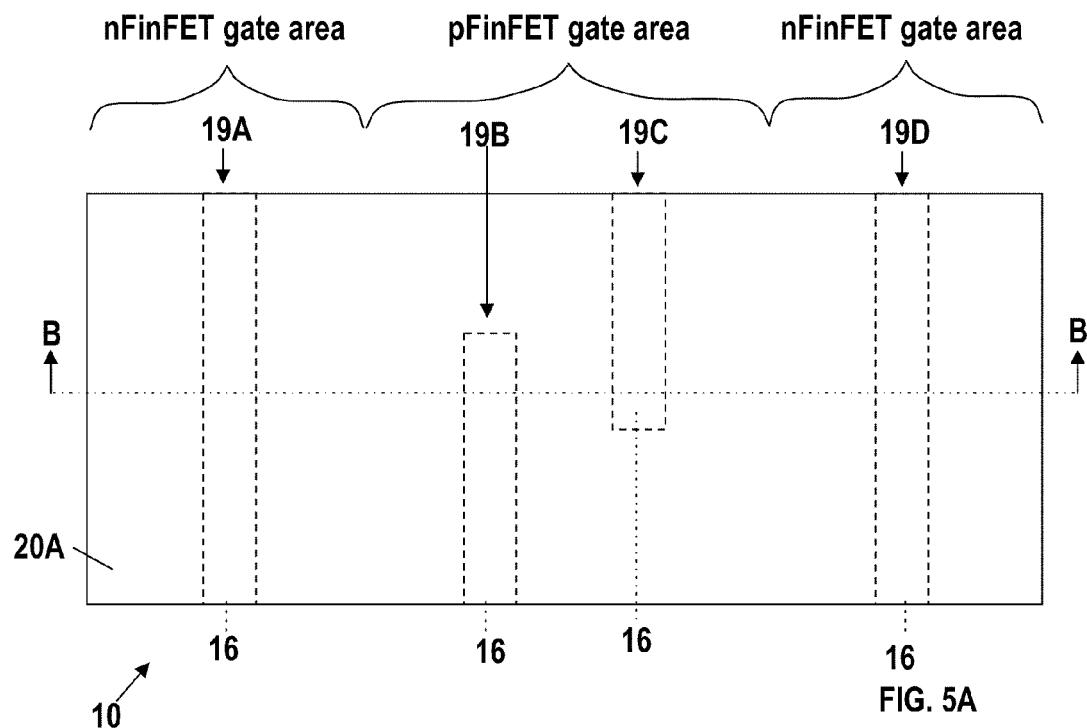
FIGS. 5A and 5B show the device of FIGS. 4A, 4B after performing step 105 in FIG. 18A by depositing a blanket undoped polysilicon layer over the device.
Figure 5B:
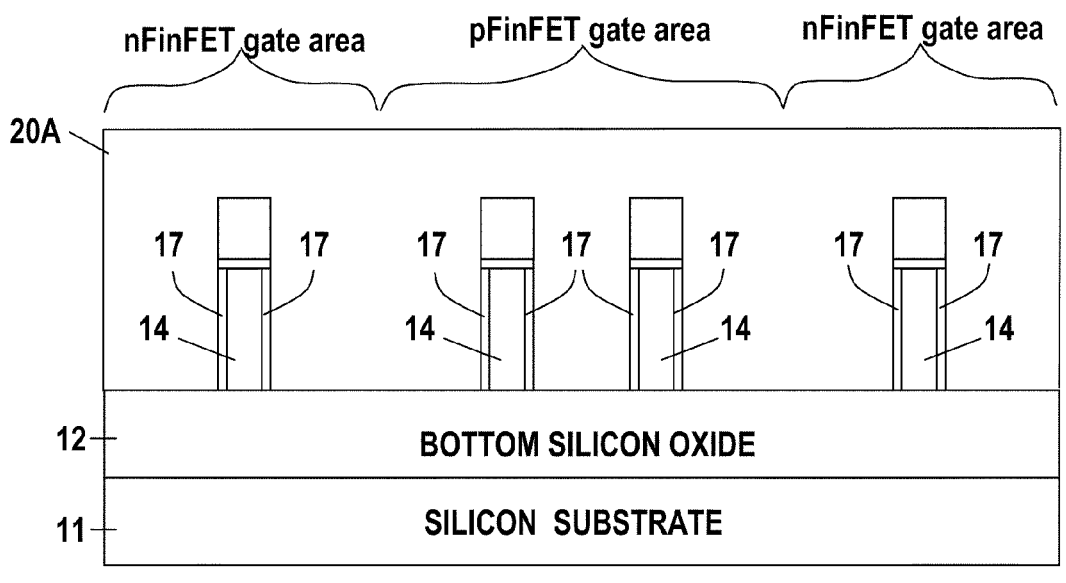

FIGS. 5A, 5B show the device 10 of FIGS. 4A, 4B after depositing a blanket undoped polysilicon layer 20A over the device 10.

Step 106

Figure 6A:
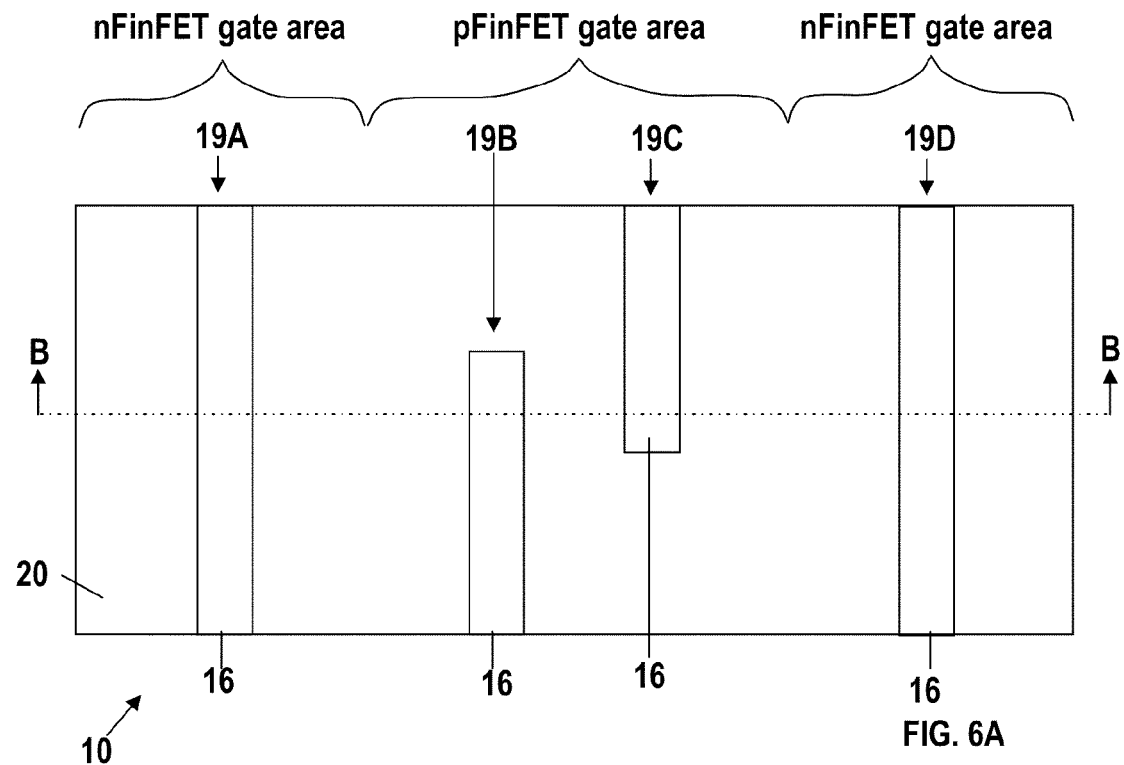
FIGS. 6A and 6B show the device of FIGS. 5A, 5B after performing step 106 in FIG. 18A by planarizing the blanket undoped polysilicon layer, stopping the planarization process when the top surfaces of the silicon nitride caps are exposed.
Figure 6B:
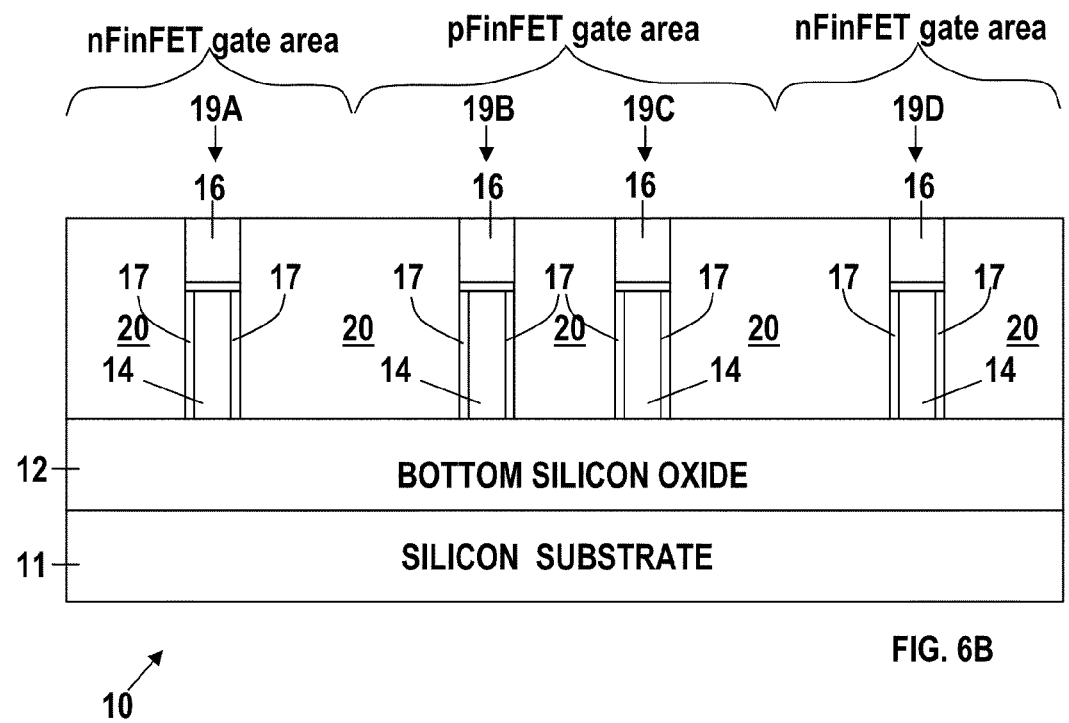

FIGS. 6A, 6B show the device 10 of FIGS. 5A, 5B after planarizing the blanket undoped polysilicon layer 20A by Chemical Mechanical Planarization (CMP) subtractive (etching and polishing) process and stopping the CMP process when the top surfaces of the silicon nitride caps 16 are exposed.

Step 107

Figures 7A, 7B:
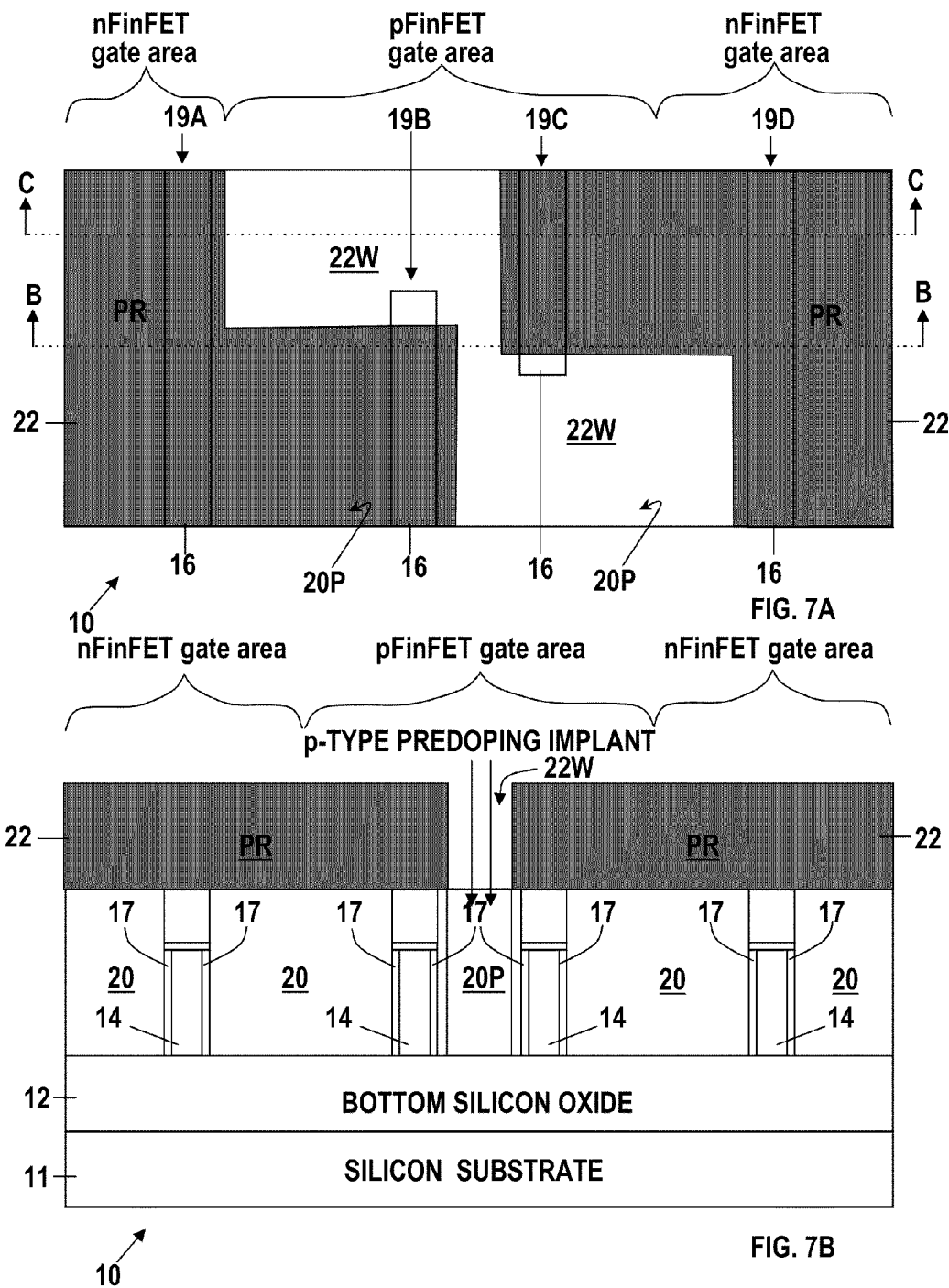
FIGS. 7A, 7B, and 7C show the device of FIGS. 6A, 6B after performing step 107 in FIG. 18A by forming a second mask for gate electrode pre-doping of the pFinFET gate electrode areas leaving some nFinFET gate areas covered by the second mask which is to be employed for pFinFET ion implantation, followed by implantation of p-type dopant ions.
Figure 7C:
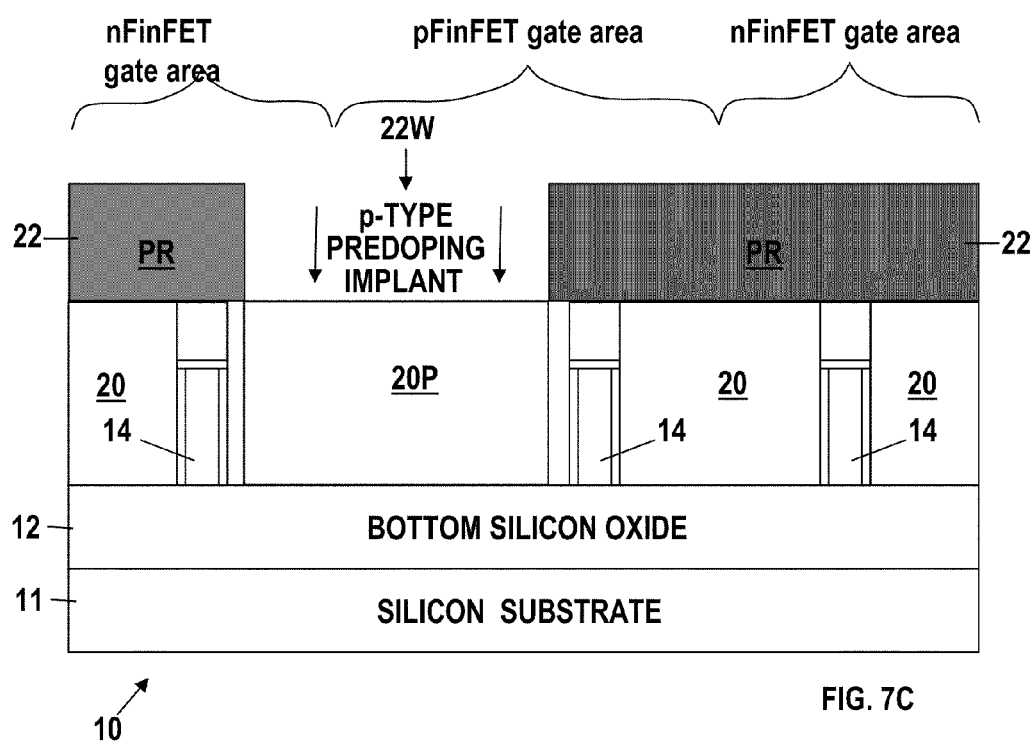

FIGS. 7A, 7B and 7C show the device 10 of FIGS. 6A, 6B after forming a second photoresist (PR) mask 22 for gate pre-doping of the pFinFET gate electrode areas leaving some nFinFET gate electrode areas covered by the second PR mask 22 which is to be employed for pFinFET ion implantation. There is an open window 22W between fin stacks 19B and 19C in FIG. 7B and between fin stacks 19A and 19C in FIG. 7C. After the second PR mask is formed and patterned implantation of p-type dopant ions is performed. With the second PR mask 22 in place, the p-type dopant is implanted through the open window 22W (through mask 22.) FIG. 7C shows a section taken along lines C-C in FIG. 7A which shows how the p-type predoped regions 20P are formed in the unmasked regions exposed through the open window 22W, which is in the center in the pFinFET gate area in FIG. 7B and to the left of center in the pFinFET gate area (between nFinFET and pFinFET gates) in FIG. 7C.

Step 108

Figure 8A:
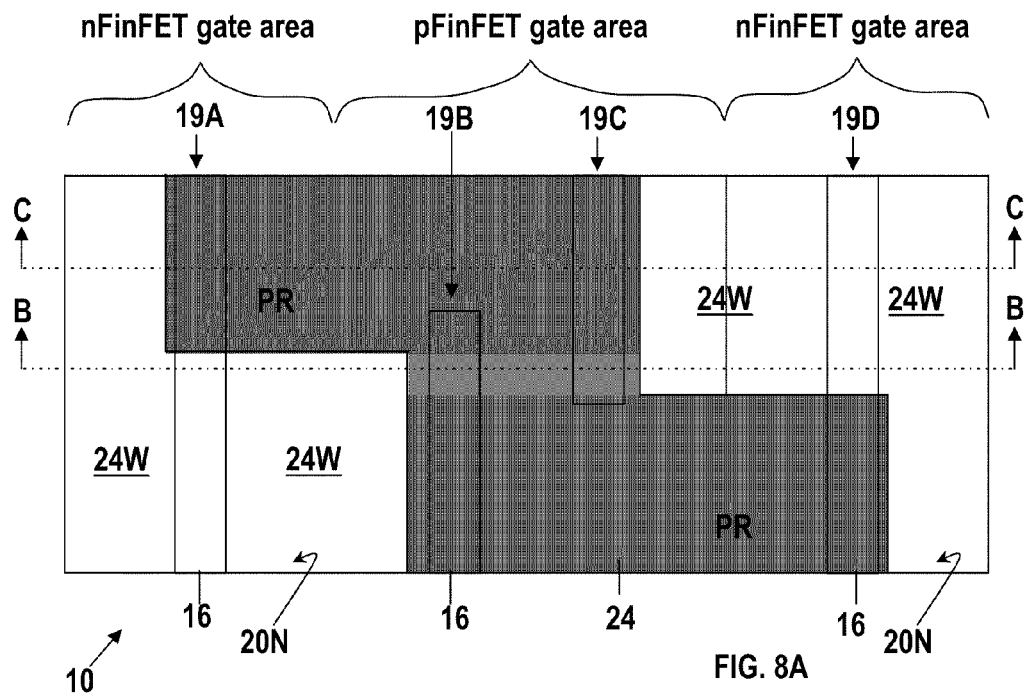
FIGS. 8A, 8B, and 8C show the device of FIGS. 7A, 7B and 7C after stripping the second mask and performing step 108 in FIG. 18A by forming a third mask for gate pre-doping of some nFinFET gate electrode areas leaving the pFinFET gate electrode areas covered by the third, nFinFET PR mask. With the third mask in place, the n-type dopant is implanted providing doping of the regions on either side of the regions doped in step 107.
Figure 8B:
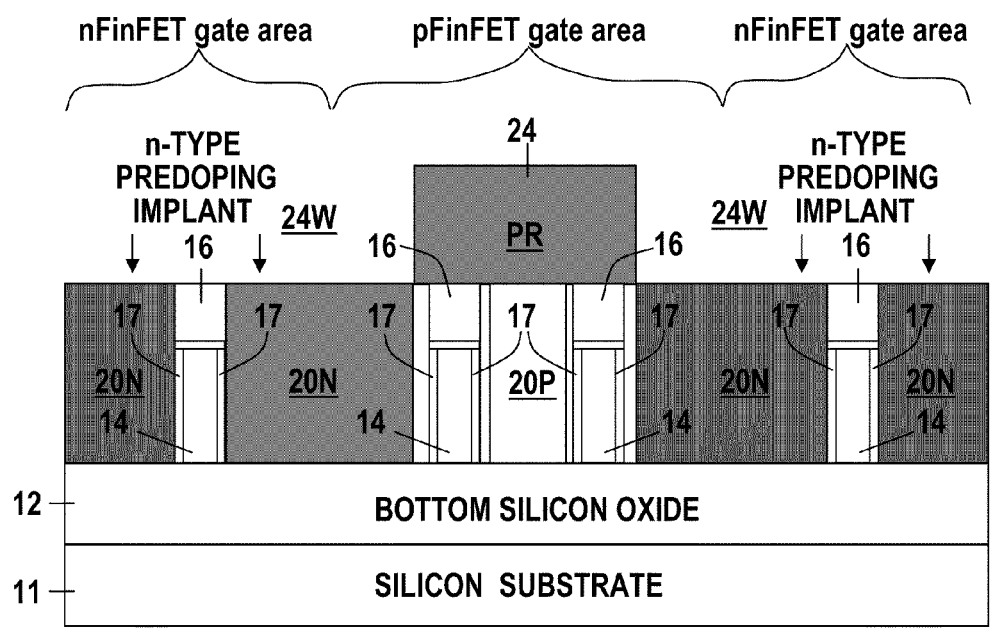
Figure 8C:
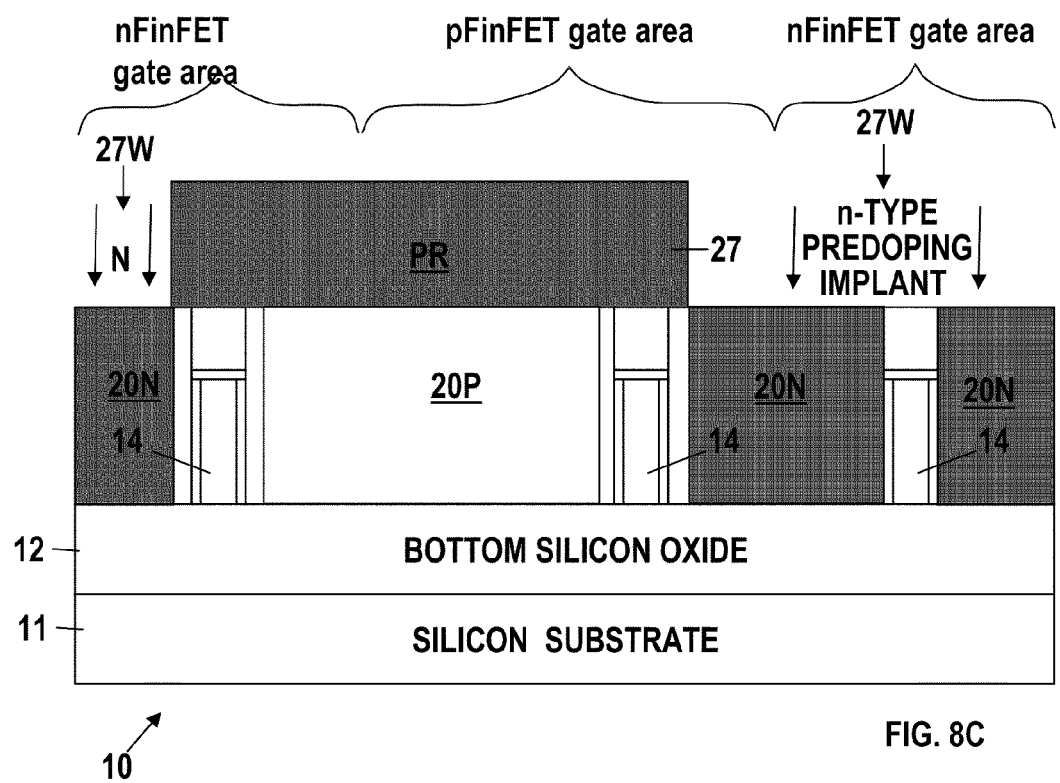

FIGS. 8A, 8B and 8C show the device 10 of FIGS. 7A, 7B and 7C after stripping the second PR mask 22 and forming a third PR mask 24 for gate pre-doping of some nFinFET gate electrode areas leaving the pFinFET gate electrode areas (previous window 22W areas) covered by the third, nFinFET photoresist mask 24. Windows 24W are provided through the third PR mask 24 leaving an exposed region on either side of the fin stack 19A reaching almost to the fin stack 19B in FIG. 8B and leaving an exposed region on either side of the fin stack 19D reaching almost to the fin stack 19C in FIG. 8C. With the third PR mask 24 in place, the n-type dopant is implanted through the open windows 24W (through mask 24) providing doping of the regions on either side of the regions doped in step 107.

Step 109

Figure 9A:
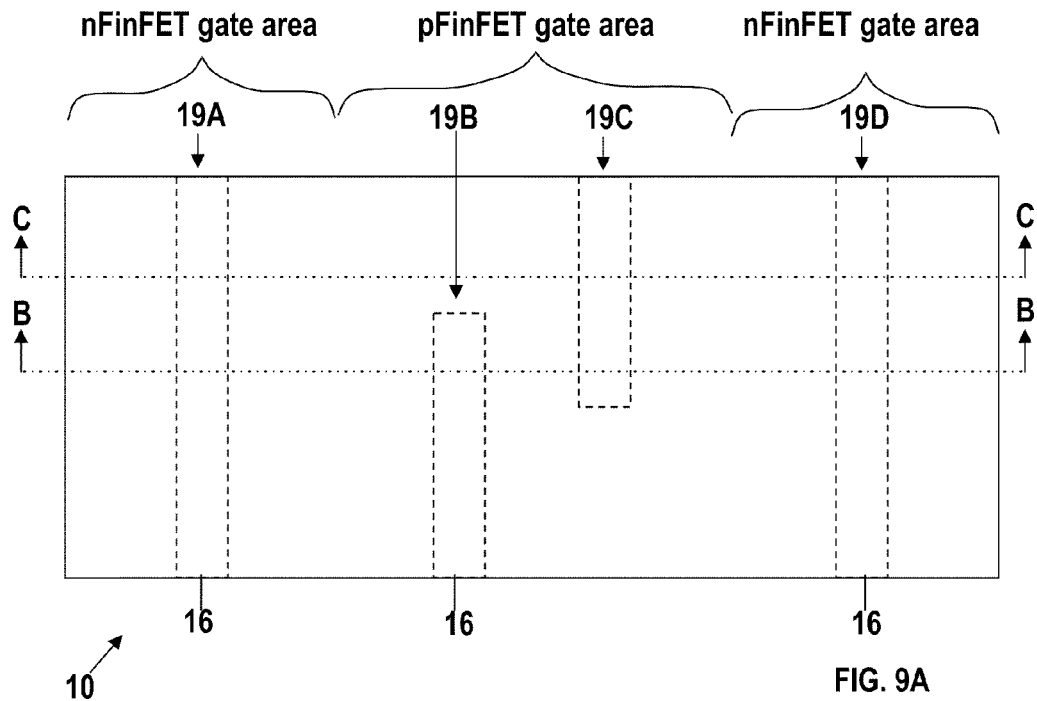
FIGS. 9A, 9B and 9C show the device 10 of FIGS. 8A, 8B and 8C after performing step 109 in FIG. 18B by stripping the third mask followed by annealing to activate the n-type dopant and the p-type dopant in the pre-doped polysilicon regions and to form P-doped polysilicon regions and form N-doped polysilicon regions shown in FIGS. 9B and 9C.
Figure 9B:
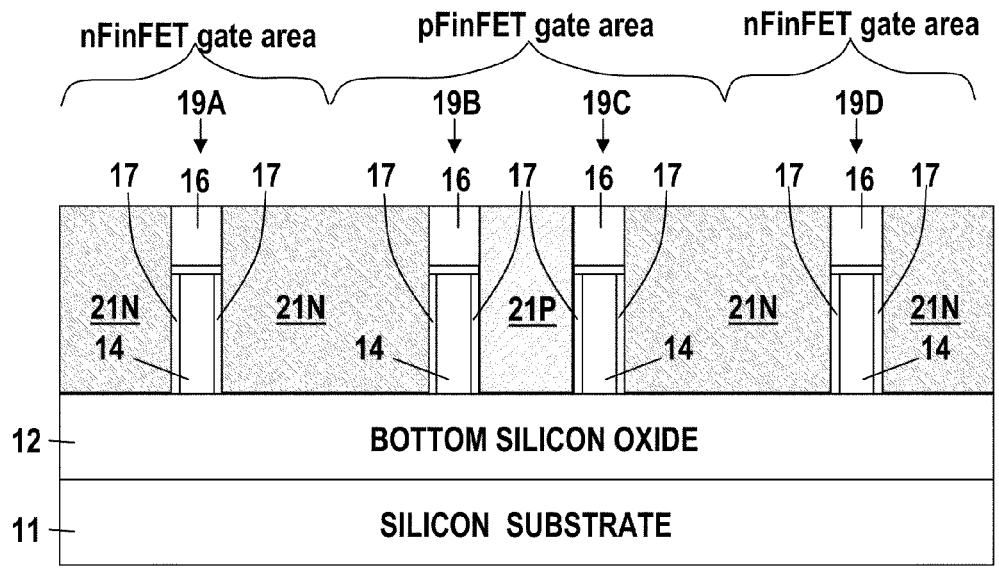
Figure 9C:
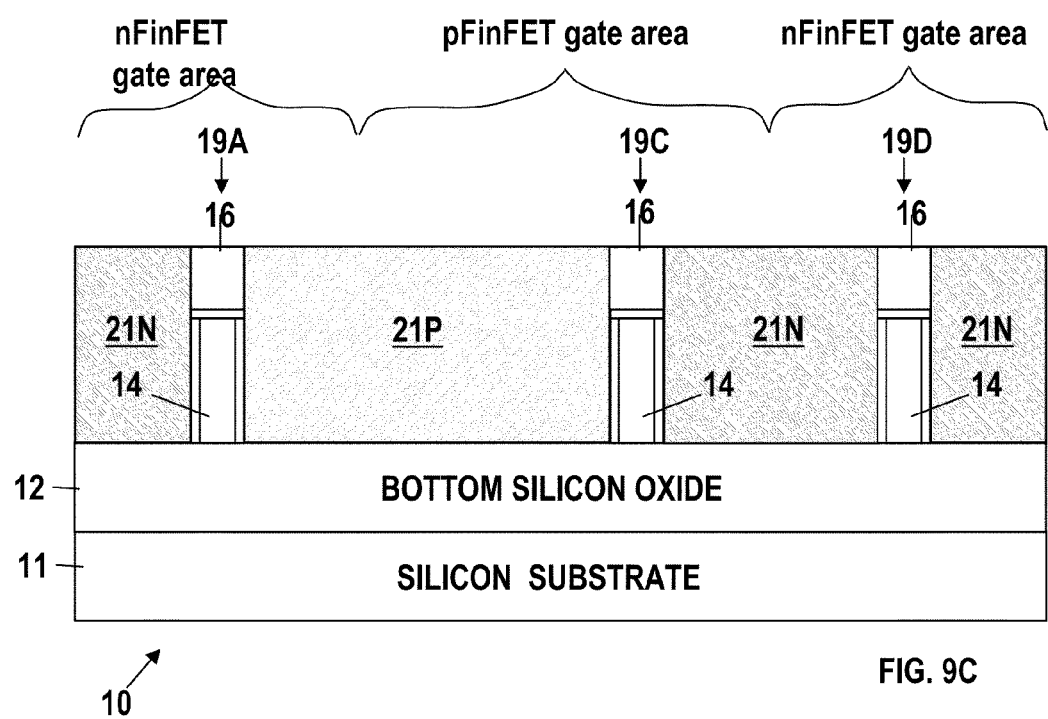

FIGS. 9A, 9B and 9C show the device 10 of FIGS. 8A, 8B and 8C after stripping the third PR mask 24 followed by annealing to activate the n-type dopant and the p-type dopant in the pre-doped polysilicon gate electrode regions 20P and 20N to form P-doped polysilicon gate electrode regions 21P between m and form N-doped polysilicon gate electrode regions 21N shown in FIGS. 9B and 9C. In FIG. 9B, the fin stacks 19A and 19D are sandwiched between N-doped polysilicon gate electrode regions 21N; the inboard edges of fin stacks 19B and 19C are juxtaposed with the P-doped polysilicon gate electrode region 21P; and the outboard edges of fin stacks 19B and 19C are juxtaposed with N-doped polysilicon gate electrode regions 21 N. In FIG. 9C, an N-doped polysilicon gate electrode regions 21N is formed to the right of the fin stack 19D; an N-doped polysilicon gate electrode region 21N is formed to the left side of fin stack 19A; a P-doped polysilicon gate electrode region 21N region is formed between the fin stacks 19A and 19C; and an N-doped polysilicon gate electrode region 21N region is formed between the fin stacks 19C and 19D. After the annealing process has been completed, due to diffusion, some of the dopant has moved laterally towards the gate oxide layers 17 providing extension of the doped polysilicon gate electrode regions 21P and 21N into those regions as well as those which were implanted with dopant. Thus, during the process of annealing, the dopant in the doped regions fills all regions (gaps) which had previously remained undoped at the end of the ion implantation process.

Step 110

Figure 10A:
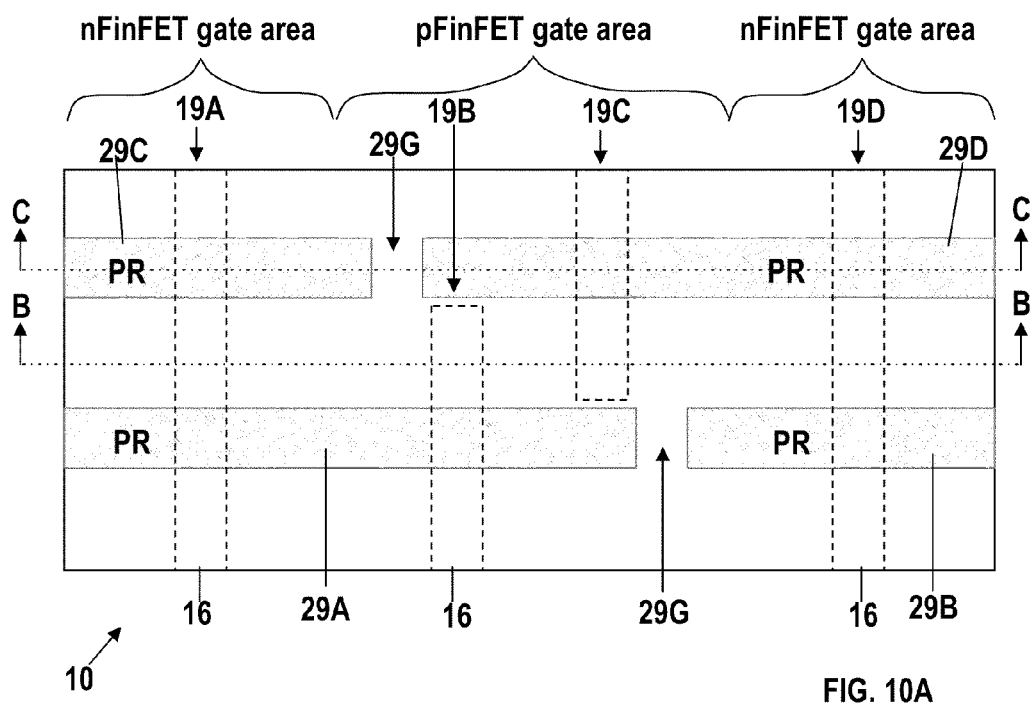
FIGS. 10A, 10B and 10C show the device 10 of FIGS. 9A, 9B and 9C after performing step 110 in FIG. 18B by deposition of a blanket undoped polysilicon gate conductor (GC) layer and a blanket $SiO_2$ layer; and formation of a fourth set of masks comprising PR parallel masking strips which extend at right angles from left to right with respect to the orientation of the fin stacks in FIGS 10A, 10B and 10C.
Figure 10B:
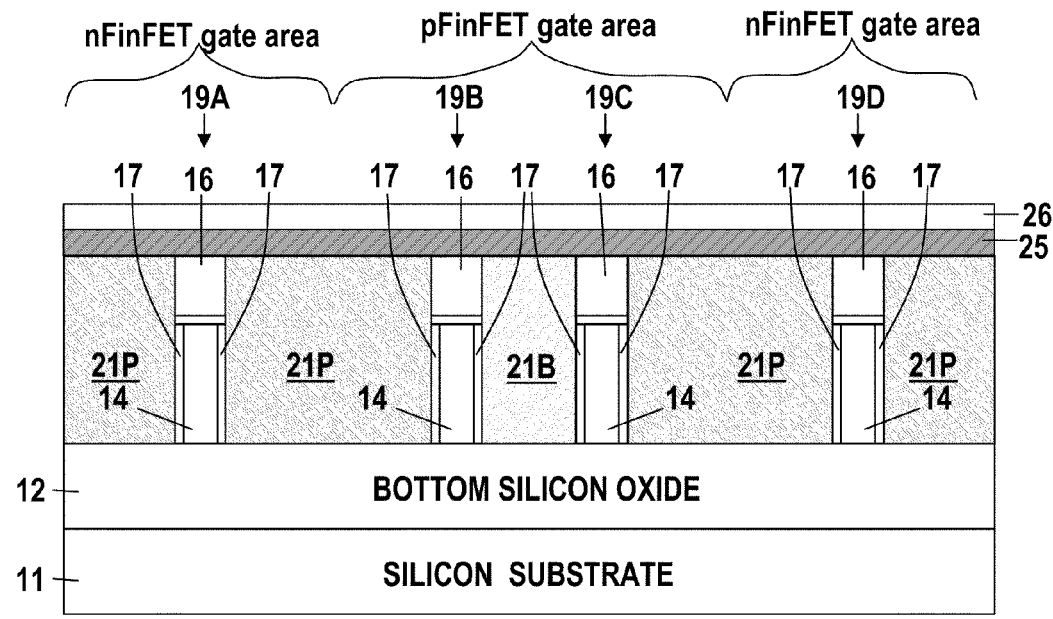
Figure 10C:
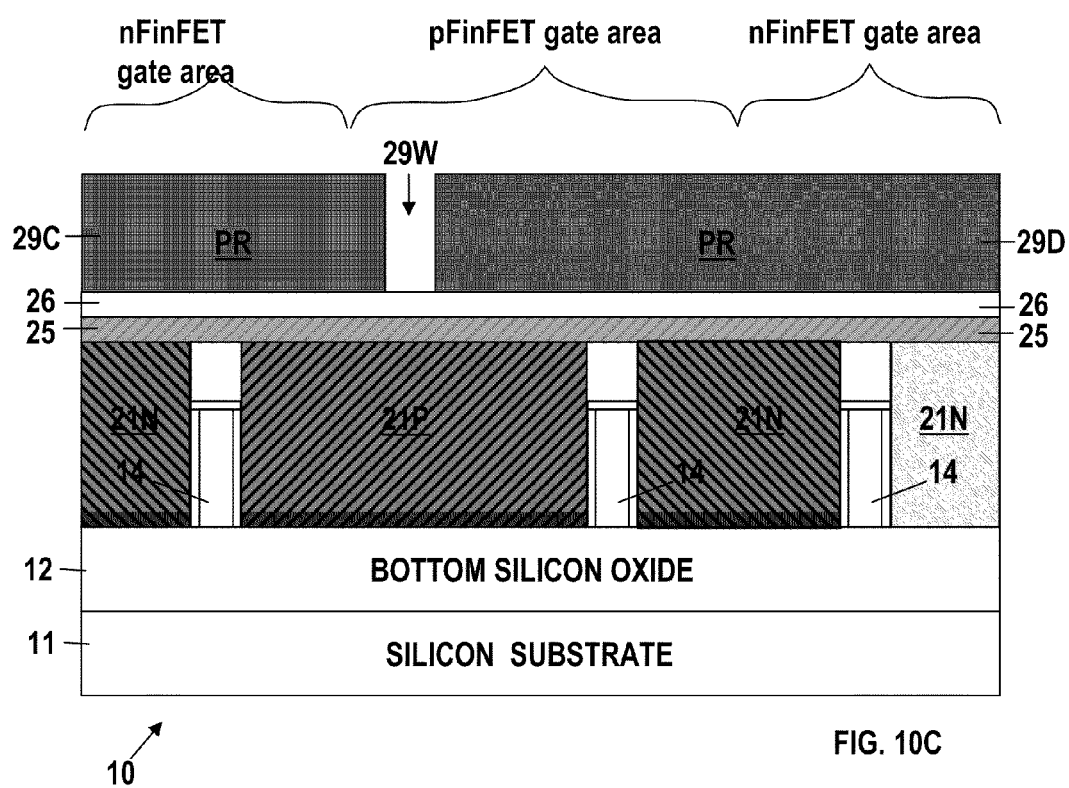

FIGS. 10A, 10B and 10C show the device 10 of FIGS. 9A, 9B and 9C after deposition of a blanket undoped polysilicon gate conductor (GC) layer 25 (~20 nm) on top surfaces of gate electrode regions 21P/21N and top surfaces of silicon nitride caps 16 and formation thereover of a blanket $SiO_2$ layer 26 (~20 nm); and formation of a fourth set of masks comprising PR parallel strips 29A-29D of photoresist which extend at right angles from left to right with respect to the orientation of the fin stacks fin stacks 19A-19D in FIGS. 10A, 10B and 10C. The first PR strip 29A is located in front of section line B-B and extends across fin stacks 19A and 19B. The second PR strip 29B is located in front of section line B-B and extends across fin stacks 19D. There is a narrow gap 29G between PR strips 29A and 29B. The third PR strip 29C is located along section line C-C in FIG. 10A and extends across fin stack 19A. The fourth PR strip 29D is located along section line C-C in FIG. 10A and extends across fin stacks 19C and 19D. There is also a narrow gap 29G between PR strips 29C and 29D. With the mask PR strips 29A-29D in place the step of patterning the gate conductors GC follows. The patterning step is performed by etching away exposed portions of polysilicon layer 25 and $SiO_2$ layer 26 aside from the those PR mask strips; followed by stripping the mask strips; which is followed in turn by performing Reactive Ion Etching (RIE) to remove exposed doped polysilicon stopping on the top surface of the bottom $SiO_2$ layer 12, forming polysilicon gate conductors 25 over the fin stacks 32 including the insulators provided by the nitride caps 6 and gate caps 15 in nFinFET and in pFinFET regions.

Step 111

Figure 11A:
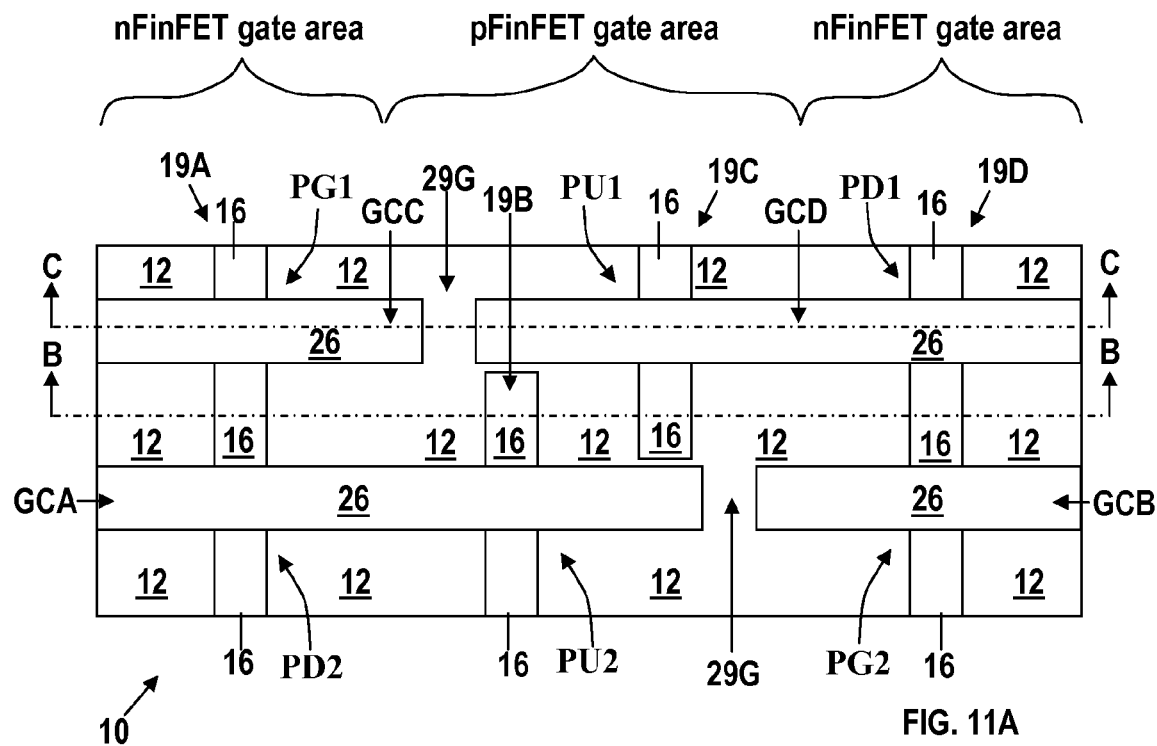
FIGS. 11A, 11B and 11C show the device 10 of FIGS. 10A, 10B and 10C after performing step 111 in FIG. 18B after removing the fourth mask and following conventional processing steps to conduct halo and extension implants into nFinFET and pFinFET regions.
Figure 11B:
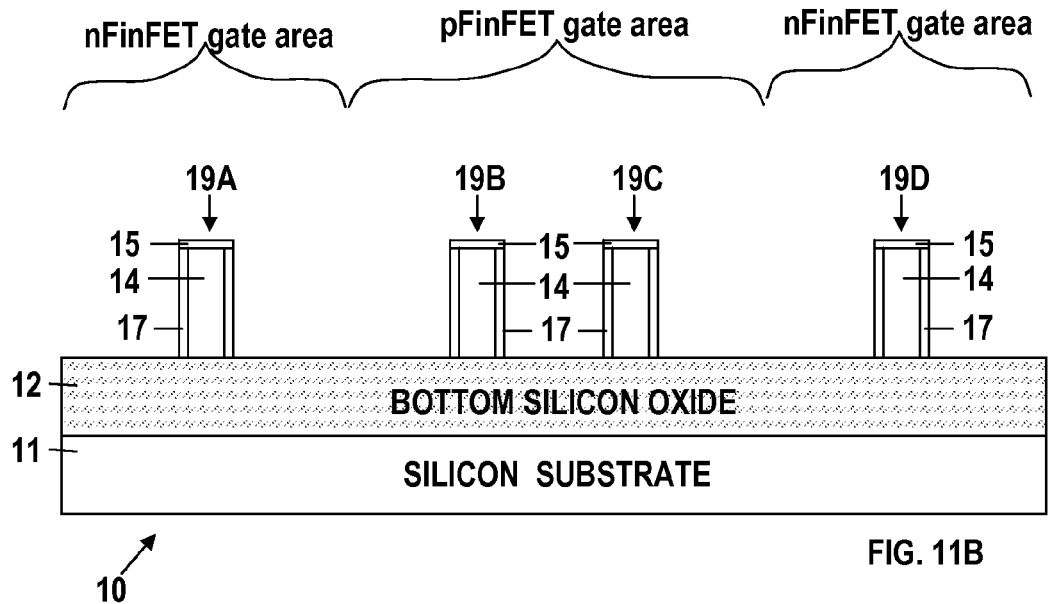
Figure 11C:
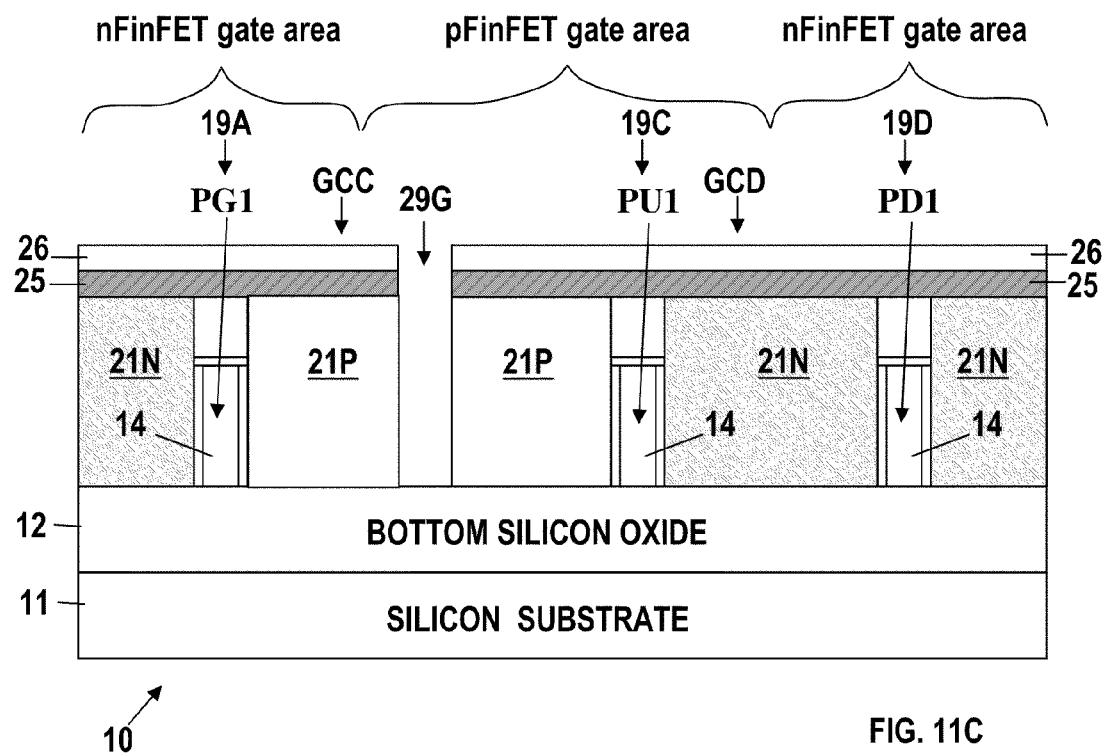
Figure 18B:
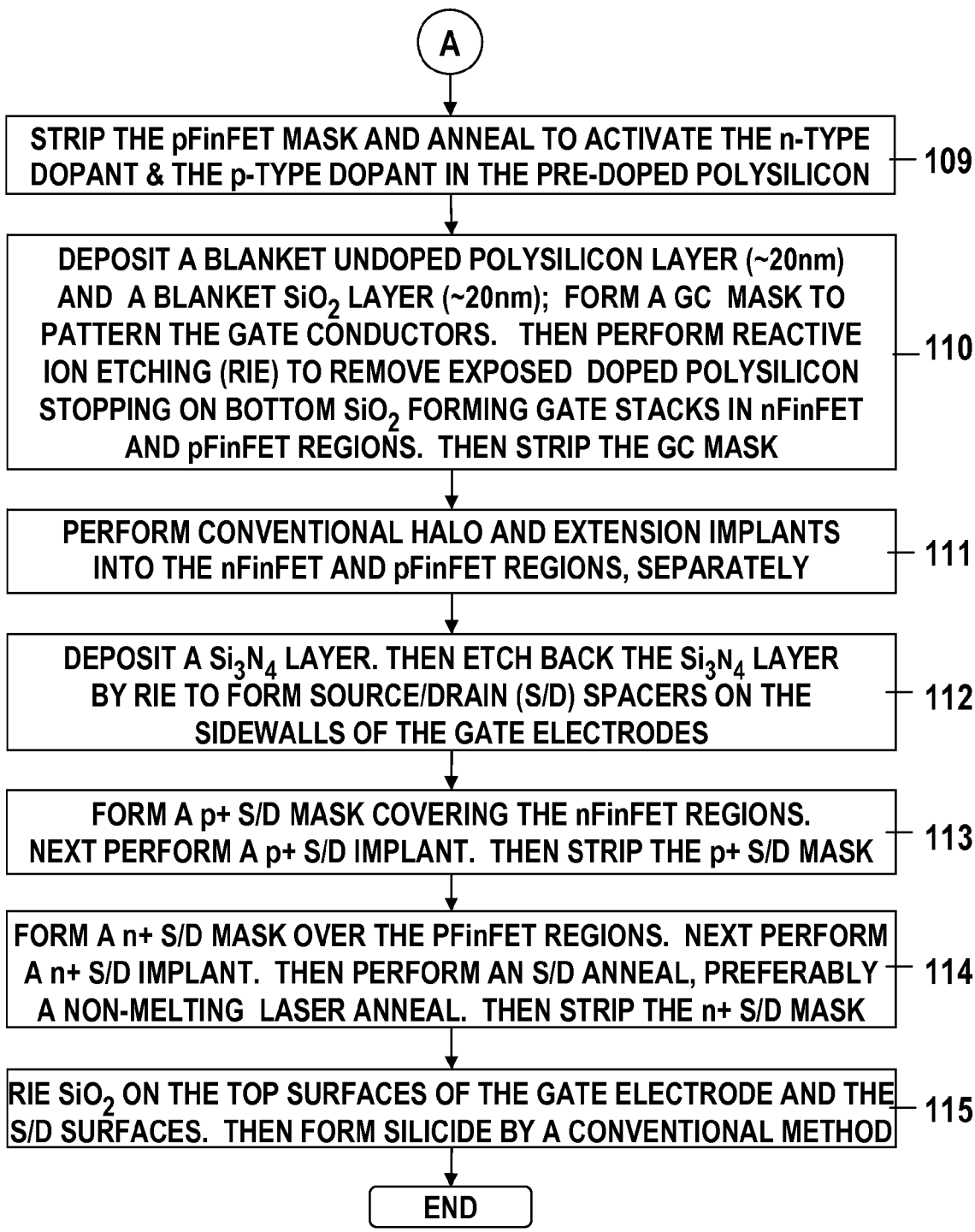

FIGS. 11A, 11B and 11C show the device 10 of FIGS. 10A, 10B and 10C after removing the fourth photoresist mask 29 and following conventional processing steps to conduct halo and extension implants into nFinFET and pFinFET regions, separately which is not shown in detail as such processing steps are well understood by those skilled in the art. If necessary, before the implants a thin spacer could be formed by employing a conventional process for adjusting implant profiles. As shown in FIGS. 11B and 11C and in view of the fact that the fin material has not been etched, as indicated by the processing steps in FIGS. 18A-18B, each of the fins 14A-14D has a flat top surface and is of uniform height and uniform width from one end to the other thereof in each of the fin stacks 19A-19D. The stacks 19A and 19D and fins 14A and 14D extend from front to back as shown in the plan view shown in FIG. 11A, where as the stack 19B and fin 14B extend from the front partially towards the back and the stack 19C and fin 14C extend from the back partially towards the front. The fins 19A and 19D are shown to be equal in length and longer from front to back than the fins 19C and 19D which are shown to be shorter from front to back and equal in length from front to back.

Step 112

Figure 12A:
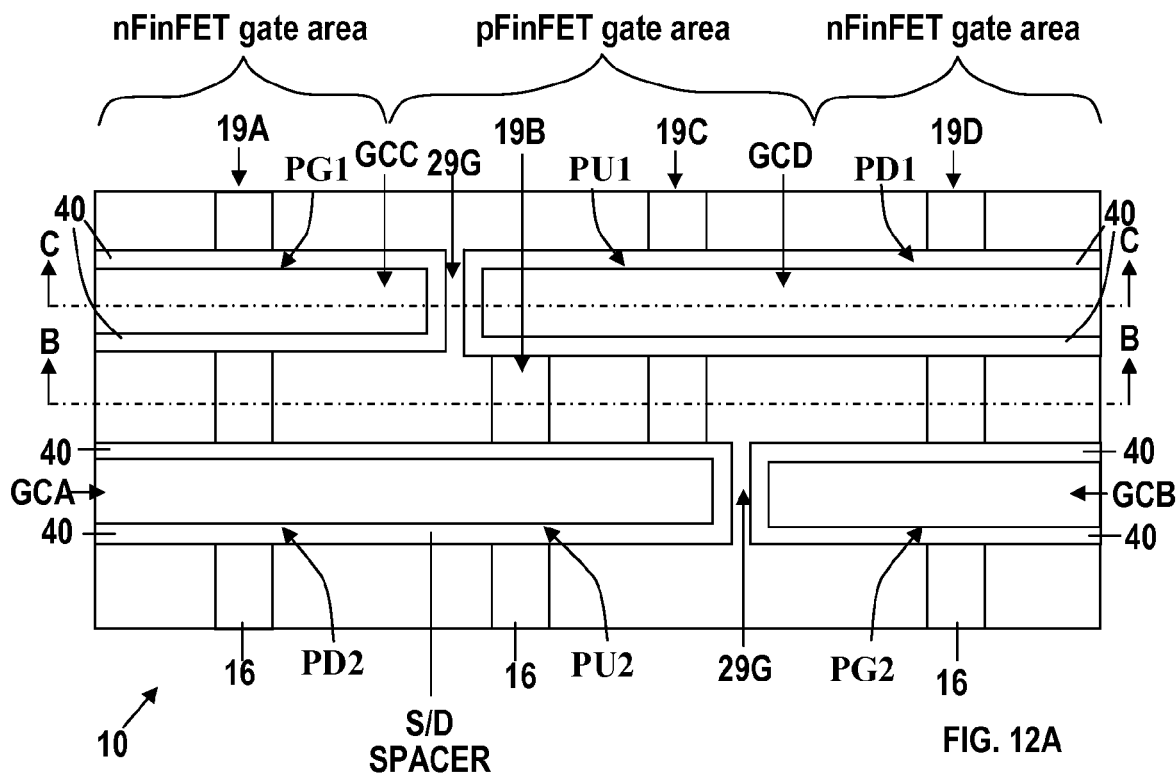
FIGS. 12A, 12B and 12C show the device 10 of FIGS. 11A, 11B and 11C after performing step 112 in FIG. 18B by depositing a thin conformal $Si_3N_4$ layer which has been etched back anisotropically by RIE to form Source/Drain (S/D) spacers on the sidewalls of the gate electrodes conductors and the gate conductor regions as can be seen in FIGS. 12A and 12C, in preparation for the performance of an S/D implant.
Figure 12B:
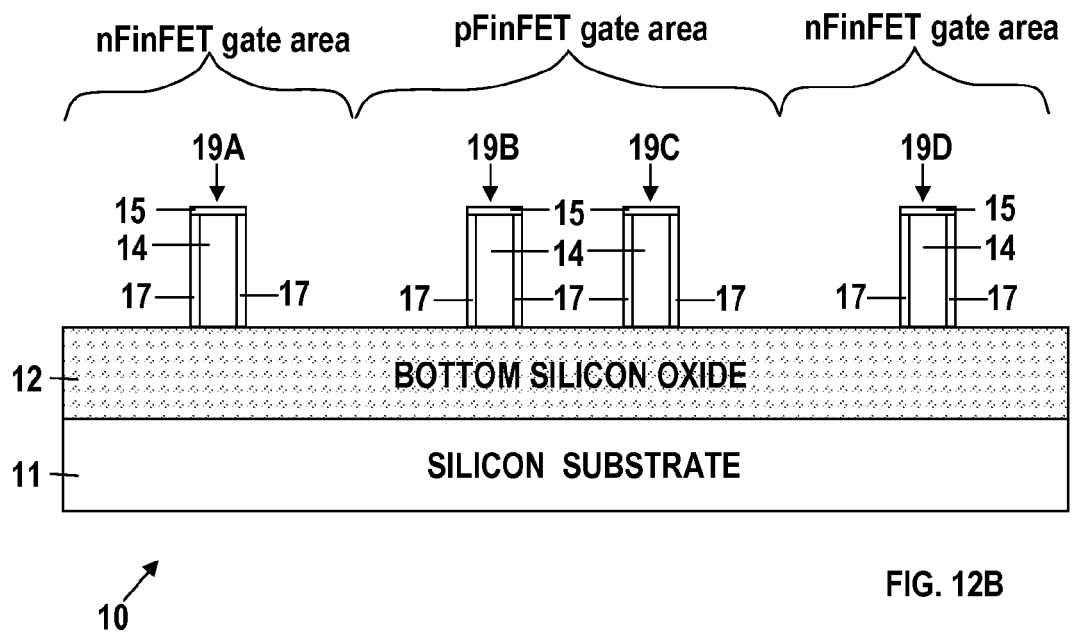
Figure 12C:
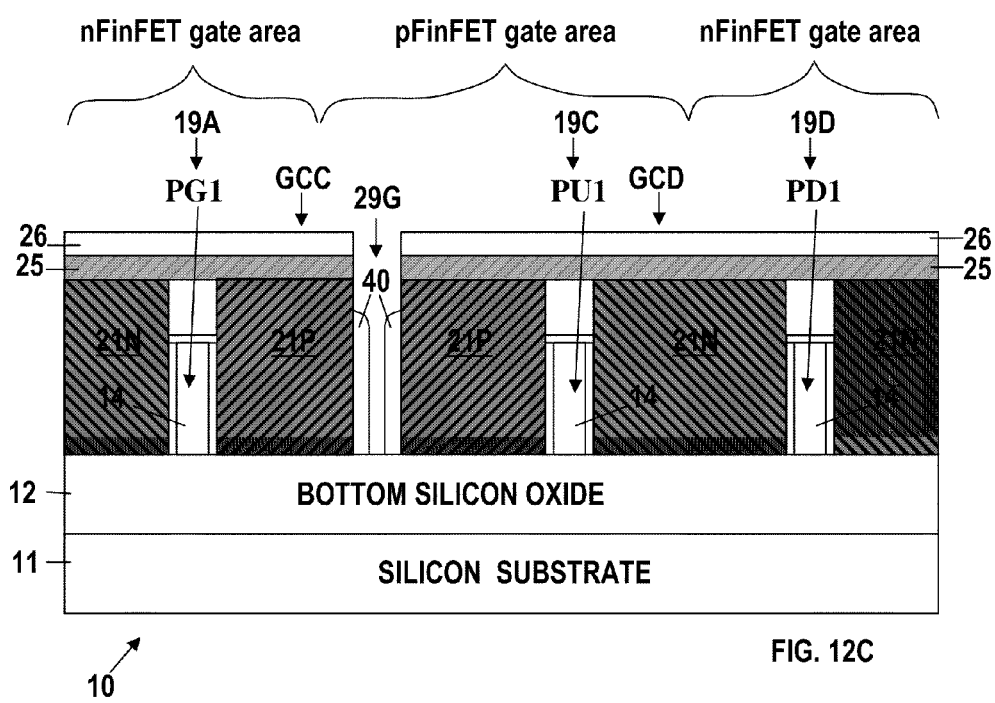

FIGS. 12A, 12B and 12C show the device 10 of FIGS. 11A, 11B and 11C after depositing a thin conformal $Si_3N_4$ layer which has been etched back anisotropically by RIE to form Source/Drain (S/D) spacers 40 on the sidewalls of the gate conductors GCA-GCD and the gate electrode regions 21P/21N as can be seen in FIGS. 12A and 12C, in preparation for the performance of an S/D implant, in a process well known to those skilled in the art.

Step 113

Figure 13A:
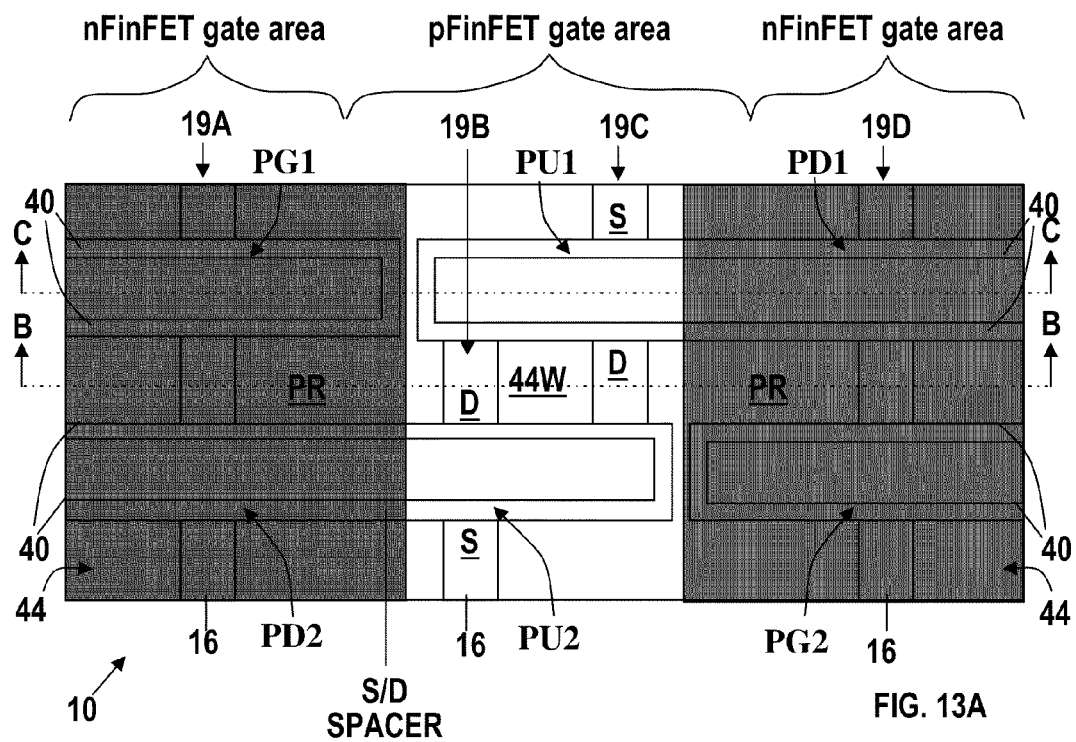
FIGS. 13A, 13B show the device of FIGS. 12A, 12B after performing step 113 in FIG. 18B by forming a p+ S/D mask over the nFinFET gate areas and performing a p+ S/D ion implantation in through the windows aside from the mask.
Figure 13B:
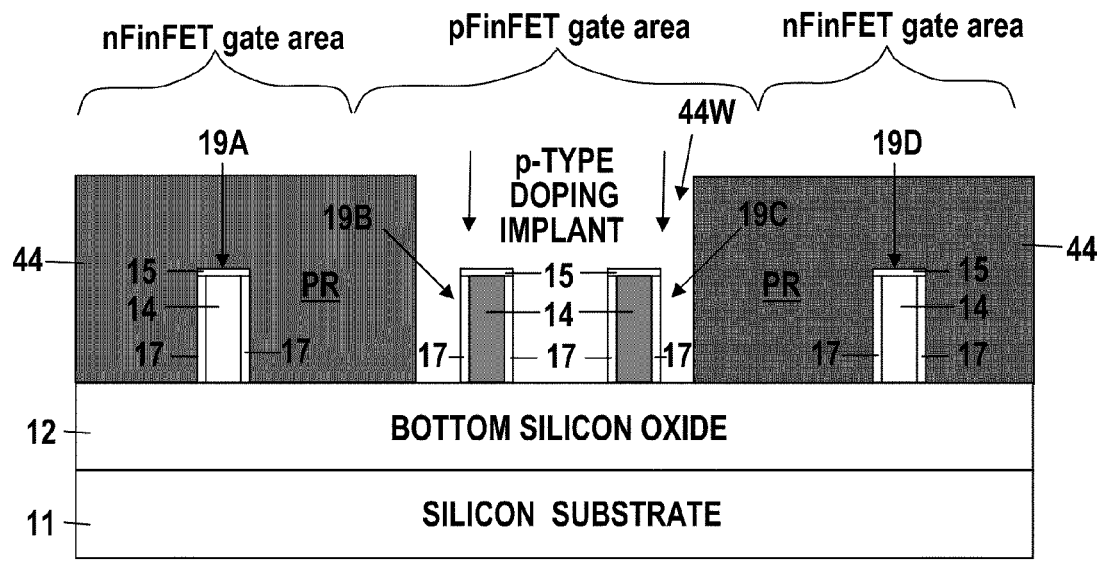

FIGS. 13A, 13B show the device 10 of FIGS. 12A, 12B after forming a p+ S/D mask 44 over the nFinFET gate areas and performing a p+ S/D ion implantation in through the windows 44W aside from the mask 44.

Step 114

Figure 14A:
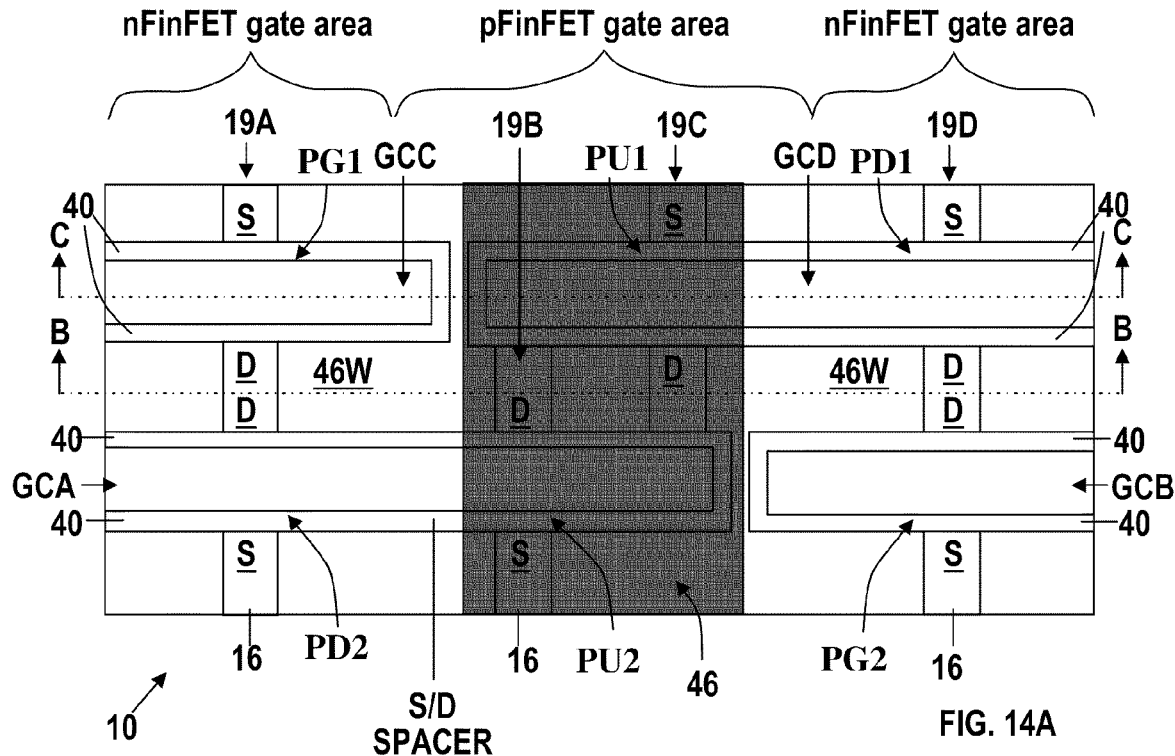
FIGS. 14A, 14B show the device of FIGS. 13A, 13B after performing step 114 in FIG. 18B by forming a n+ S/D mask over the nFinFET gate areas and performing an n+ S/D ion implantation in through windows aside from the mask; then after removing the mask an S/D annealing step is performed.
Figure 14B:
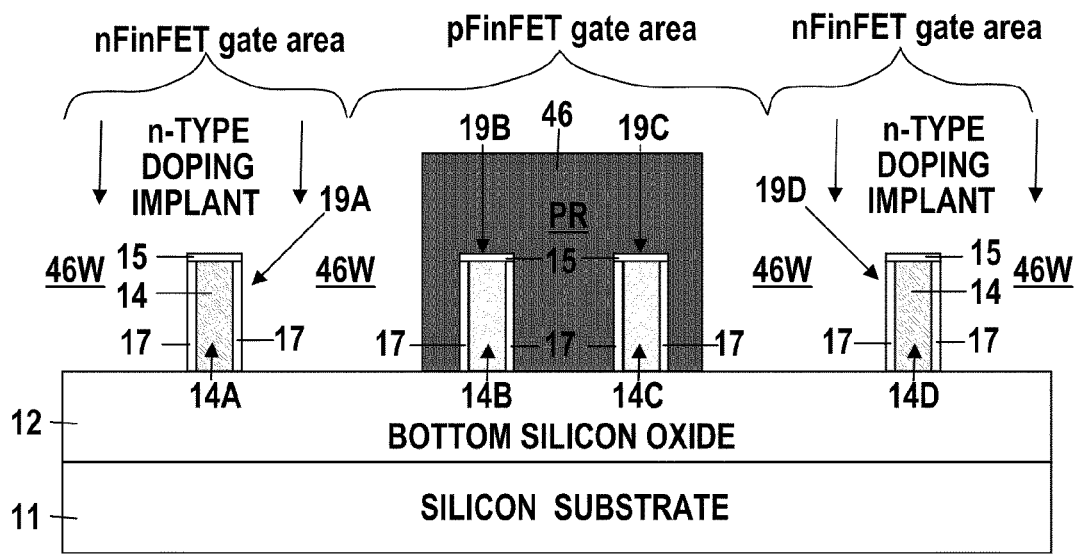

FIGS. 14A, 14B show the device 10 of FIGS. 13A, 13B after forming a n+ S/D mask 46 over the nFinFET gate areas and performing an n+ S/D ion implantation in through the windows 46W aside from the mask 46. Subsequently, after removing the mask 46, an S/D annealing step is performed, preferably by employing a non-melting laser annealing process to activate the dopant implanted in both step 113 and the current step 114. FIG. 14A shows that the stack 19A including, fin 14A extends under the gate GCC of the finFET PG1 and under the gate GCA of the finFET PD2. As before, the fin 14A has a flat top surface and is uniformly wide and uniformly tall from front to back. FIG. 14A also shows that the stack 19D including fin 14D extends under the gate GCB of the finFET PG2 and under the gate GCD of the finFET PD1. Also, as before, the fin 14D has a flat top surface and is uniformly wide and uniformly tall from front to back. The fins 14B and 14C are uniformly wide and uniformly tall from the front to the back thereof.

Step 115

Figure 15A:
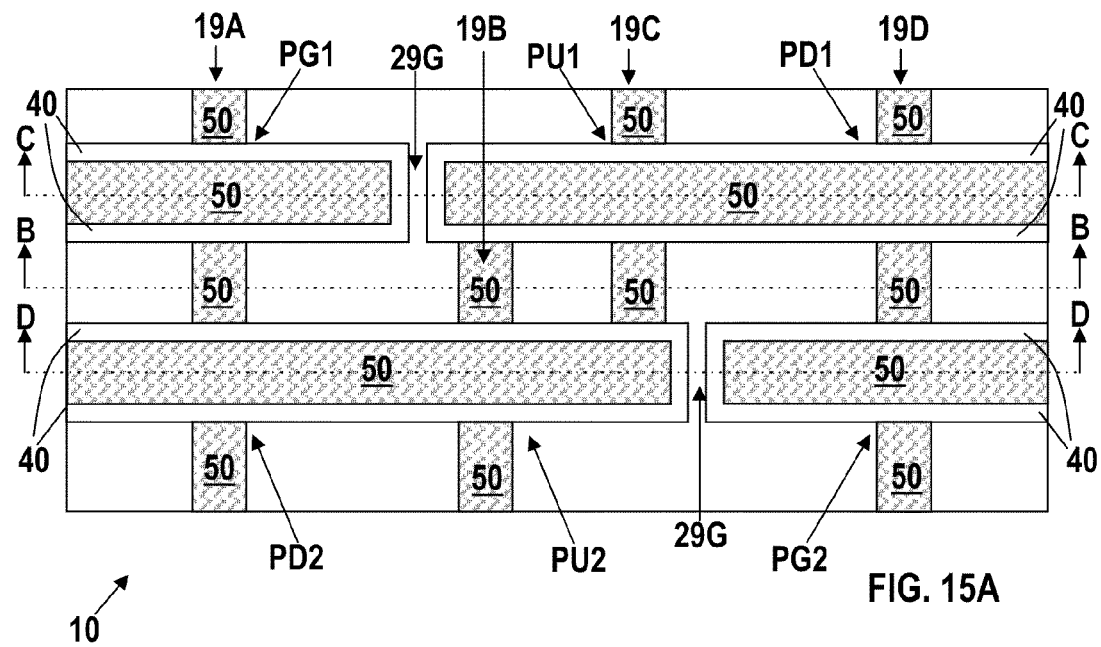
FIGS. 15A, 15B, 15C and 15D show the device of FIGS. 14A, 14B after performing step 115 in FIG. 18B by performing etching to remove the $SiO_2$ cap layer on the top surface of the fins 19A-19B and the layer on the top surfaces of the gate conductors GCA-GCD and the exterior S/D surfaces, and to form a silicide layer.
Figure 15B:
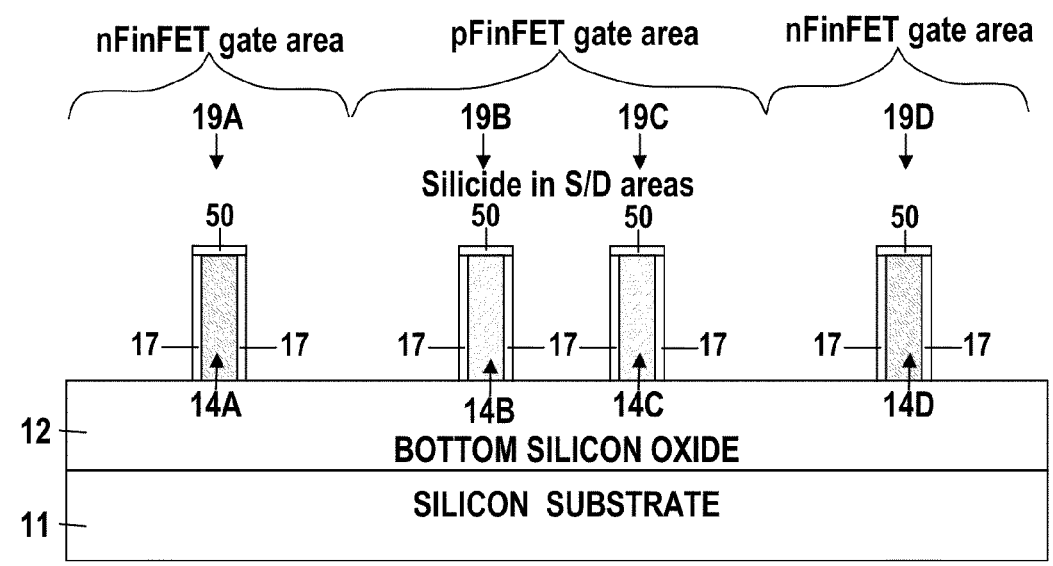
Figure 15C:
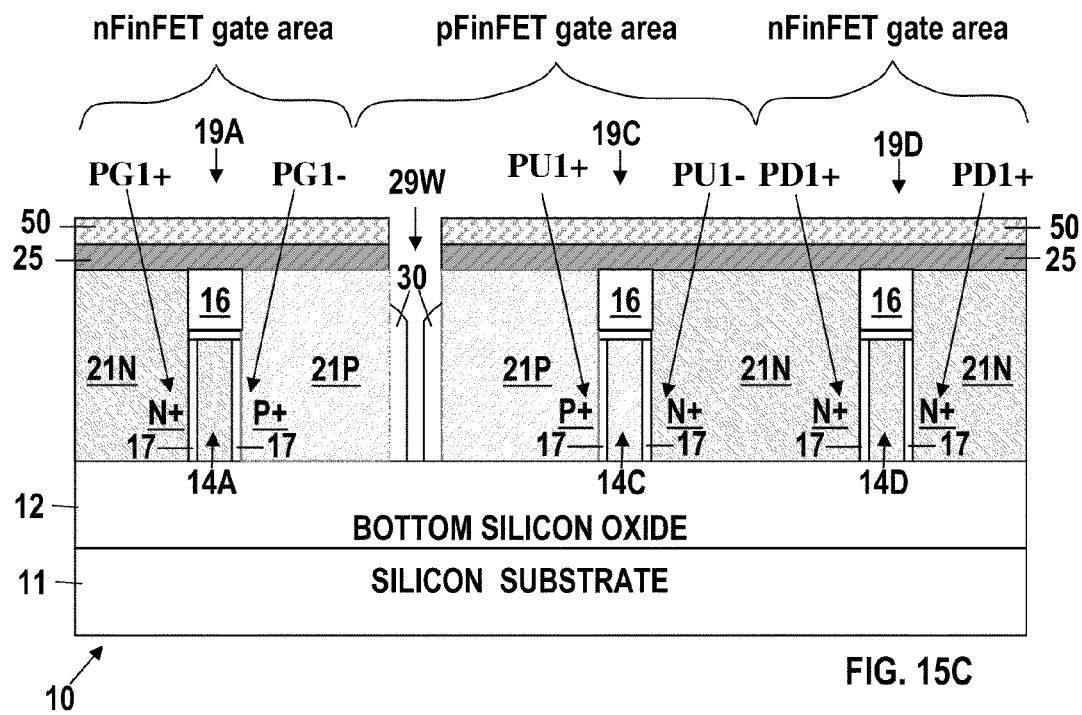
Figure 15D:
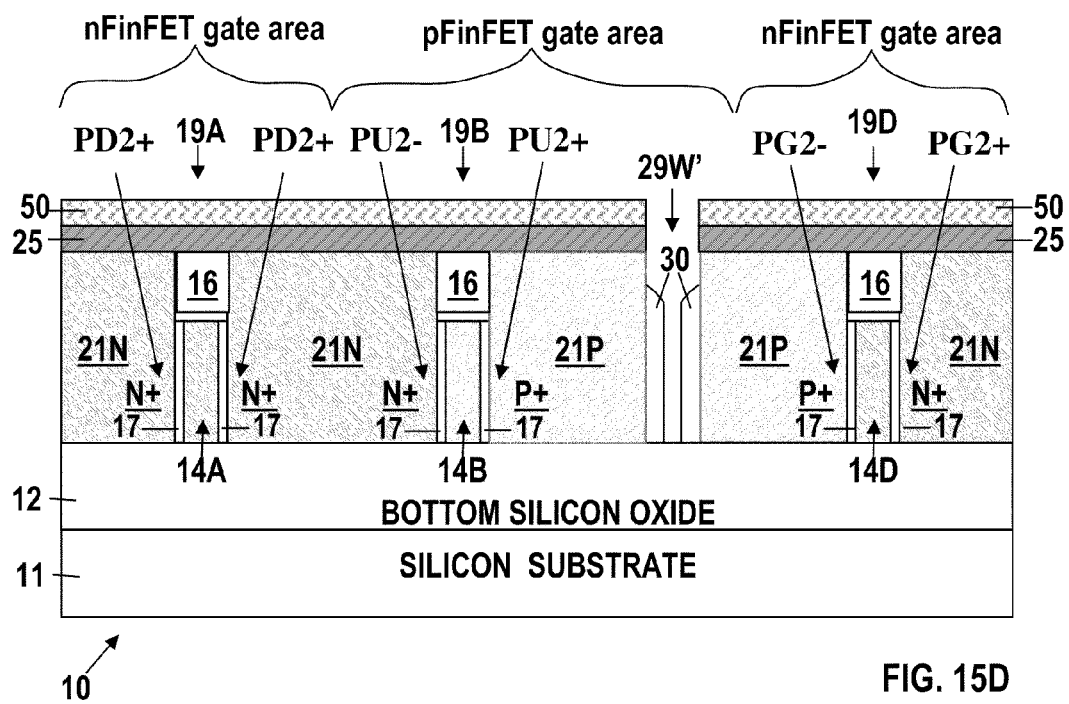

FIGS. 15A, 15B, 15C and 15D show the device 10 of FIGS. 14A, 14B after performing etching with an RIE to remove the $SiO_2$ cap layer 15 on the top surface of the fins 19A-19B and polysilicon layer 25 on the top surfaces of the gate conductors GCA-GCD and the exterior S/D surfaces of gate electrode regions 21P/21N, and form a silicide layer 50 by a conventional method. FIG. 15C shows a section taken along lines C-C in FIG. 15A, and FIG. 15D shows a section taken along lines D-D in FIG. 15A. In the plan view of FIG. 15A, fin stacks 19A-19D have uniform widths from one end to the other. The stacks 19A and 19D and fins 14A and 14D continue to extend from front to back as shown in the plan view shown in FIG. 15A. Fin stack 19A extends under the gate electrodes for both of the pFETs PG1 and PD2. Fin stack 19D extends under the gate electrodes for both of the pFETs PG2 and PD1. FIGS. 15B-15C show that the fins 14A-14D have flat top surfaces and to have uniform heights and widths, as they are unmodified by removal of material therefrom or addition of material thereto since the step of FIGS. 3A-3B.

Figure 16A:
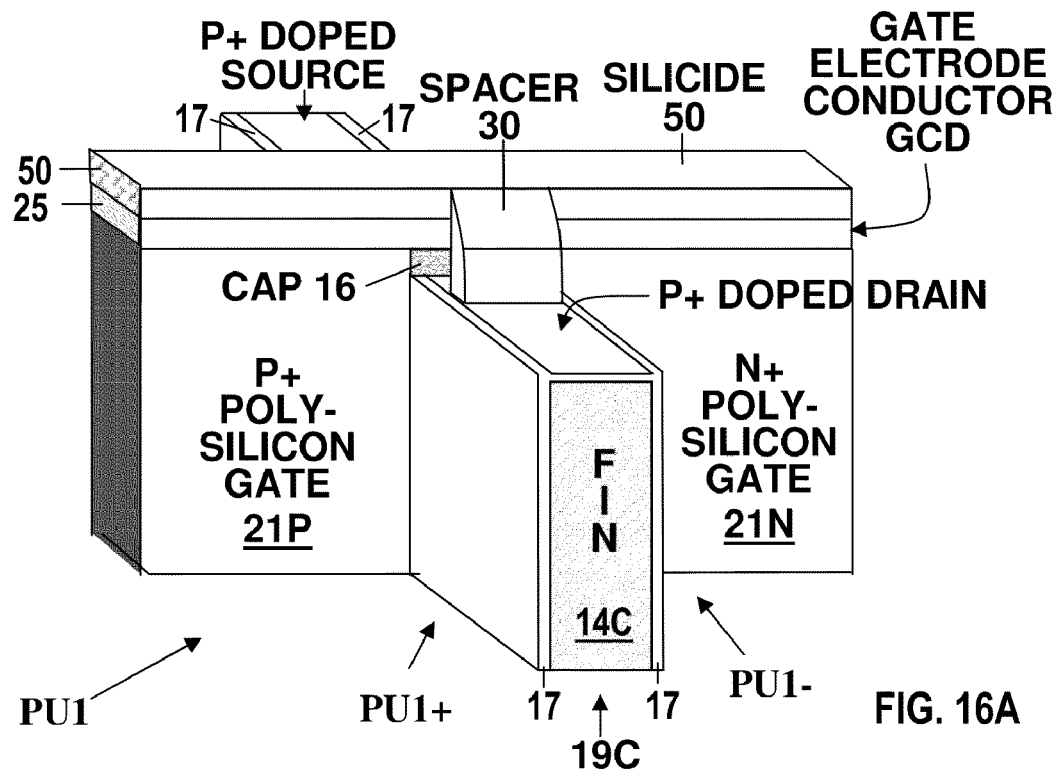
FIG. 16A-16F are perspective views of the bilateral transistors of FIGS. 15A, 15B and 15C.

FIG. 16A is a perspective view of the bilateral pull-up transistor PU1 of FIGS. 15A and 15C formed on the fin 14C of fin stack 19C with a section of P+ doped drain and with a section of the P0+ doped second fin including a sidewall gate electrode in region 21P exposed. The conventionally-doped separate sidewall gate (P+ doped) electrode region 21P shown on the left hand side of on the left hand sidewall of fin 14C and the separate counter-doped-gate (N+ doped) sidewall gate electrode in region 21N shown on the right hand side of right hand sidewall of the fin 14C in the stack 19C. FIG. 15C shows gate oxide layers 17 formed on sidewalls of the fin 14C of the fin stack 19C thereby separating the sidewall gate electrodes in regions 21P and 21N from the fin 14C. The silicon nitride cap 16 which is a dielectric layer is shown between the top surface of the fin 14C of fin stack 19C and the bottom surface of the doped polysilicon layer 25 of the gate conductor GCD. The silicide layer 50 is shown on top of the polysilicon layer 25 and aside from the channel is shown on the sidewalls and the top surface of the fin 14C of fin stack 19C. The gate conductor GCD is in electrical contact with the top surfaces of both of the separate sidewall gate electrodes in regions 21P and 21N. The bilateral transistors PU1+ and PU1− are formed to the left and the right of the fin 14C of fin stack 19C. The conventional-doped-gate FinFET transistor PU1+ is formed by the P+ doped source/drain regions, the channel therebetween and the separate sidewall gate electrode in region 21P. The counter-doped-gate FinFET transistor PU1− is formed by the P+ doped source/drain regions, the channel therebetween and the N+ doped separate sidewall gate electrode in region 21N.

Figure 16B:
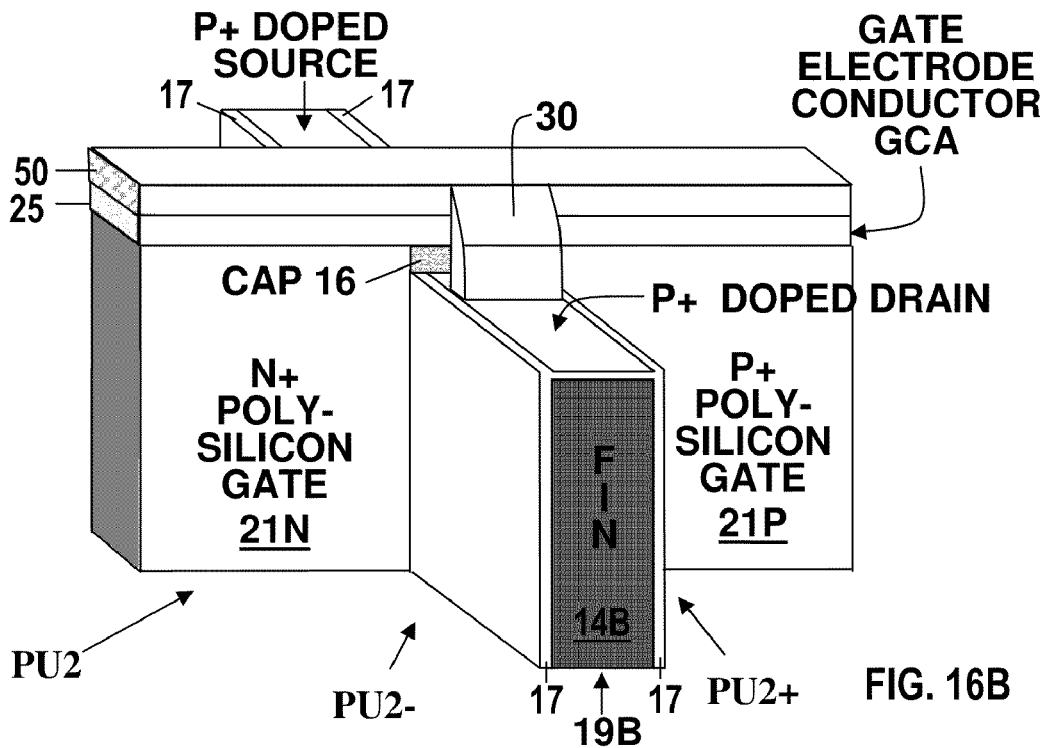

FIG. 16B is a perspective view of the bilateral pass gate transistor PG2 of FIGS. 15A and 15C formed on the fin 14B of fin stack 19B with a section of P+ doped drain and with a section of the N+ doped separate sidewall gate electrode in region 21N exposed. The counter-doped-gate (N+ doped) separate sidewall electrode region 21N shown on the left hand side of on left hand sidewall of fin 14B of stack 19B and the conventionally-doped-gate electrode (P+ doped) separate sidewall gate electrode in region 21P shown on the right hand side of right hand sidewall of fin 14 stack 19C. FIG. 15C shows gate oxide layers 17 formed on sidewalls of fin 14B of fin stack 19B, thereby separating the sidewall gate electrodes in the regions 21N and 21P from the fin 14B. The silicon nitride cap 16 (a dielectric layer) is shown between the top surface of the fin 14B of fin stack 19B and the bottom surface of the doped polysilicon layer 25 of the gate conductor GCA. The silicide layer 50 is shown on top of the polysilicon layer 25 and aside from the channel is shown on the sidewalls and the top surface of the fin 14B of fin stack 19B. The gate conductor GCA is in electrical contact with the top surfaces of both of the separate sidewall gate electrodes in regions 21N and 21P. The bilateral transistors PU2− and PU2+ are formed to the left and the right of the fin 14B of fin stack 19B. The counter-doped-gate FinFET transistor PU2− is formed by the P+ doped source/drain regions, the channel therebetween and the N+ doped separate gate electrode in region 21N. The conventional-doped-gate FinFET transistor PU2+ is formed by the P+ doped source/drain regions, the channel therebetween and the separate, sidewall gate electrode in region 21P.

Figure 16C:
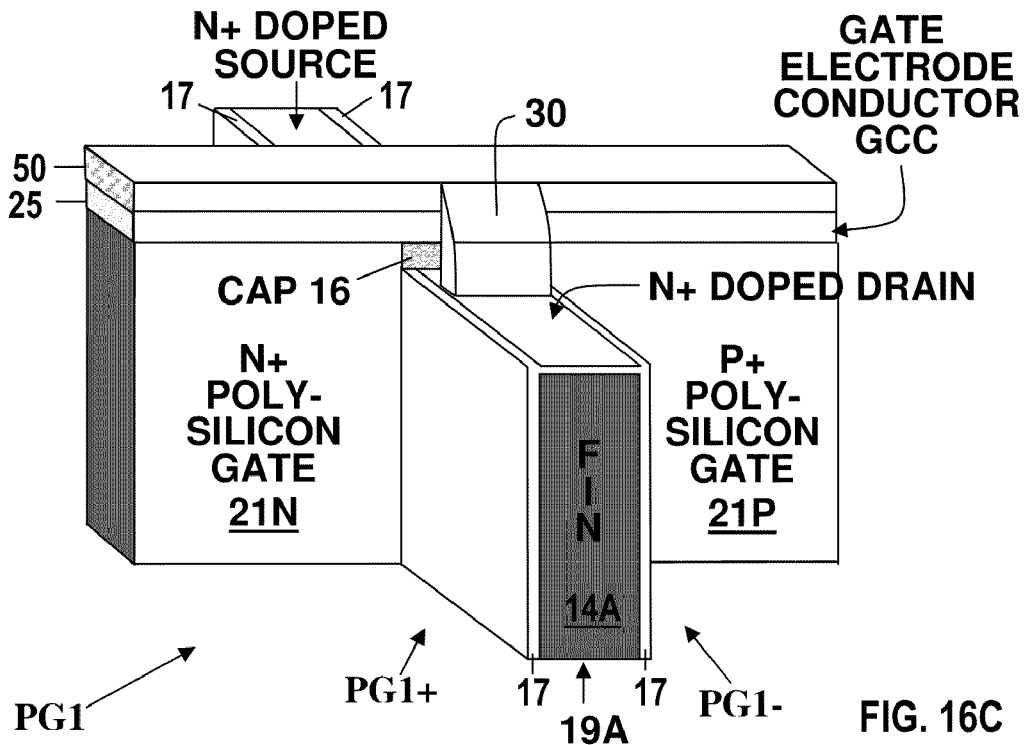

FIG. 16C is a perspective view of the bilateral pull-up transistor PU1 of FIGS. 15A and 15C formed on the fin 14A of fin stack 19A with a section of P+ doped drain and with a section of the N+ doped separate sidewall gate electrode in region 21N exposed. The conventionally-doped-separate sidewall gate electrode region 21N shown on the left hand side of on the left hand sidewall of fin 14A of stack 19C and the counter-doped separate sidewall gate electrode region 21P shown on the right hand side of on the right hand sidewall of fin 14A stack 19A. As shown in FIG. 15C gate oxide layers 17 are formed on the sidewalls of the fin 14A of fin stack 19A, thereby separating the electrode regions 21N and 21P from the fin 14A. The silicon nitride cap 16 which is a dielectric layer is shown between the top surface of the fin 14A of fin stack 19A and the bottom surface of the doped polysilicon layer 25 of the gate conductor GCC. The silicide layer 50 is shown on top of the polysilicon layer 25 and aside from the channel is shown on the sidewalls and the top surface of the fin 14A of fin stack 19A. The gate conductor GCC is in electrical contact with the top surfaces of both of the separate sidewall gate electrode in regions 21N and 21P. The bilateral transistors PG1+ and PG1− are formed to the left and the right of the fin 14A of fin stack 19A. The conventional-doped-gate FinFET transistor PG1+ is formed by the N+ doped source/drain regions, the channel therebetween and the separate gate electrode region 21N on the left. The counter-doped-gate FinFET transistor PG1− is formed by the N+ doped source/drain regions, the channel therebetween and the P+ doped separate sidewall gate electrode in region 21P on the right.

Figure 16D:
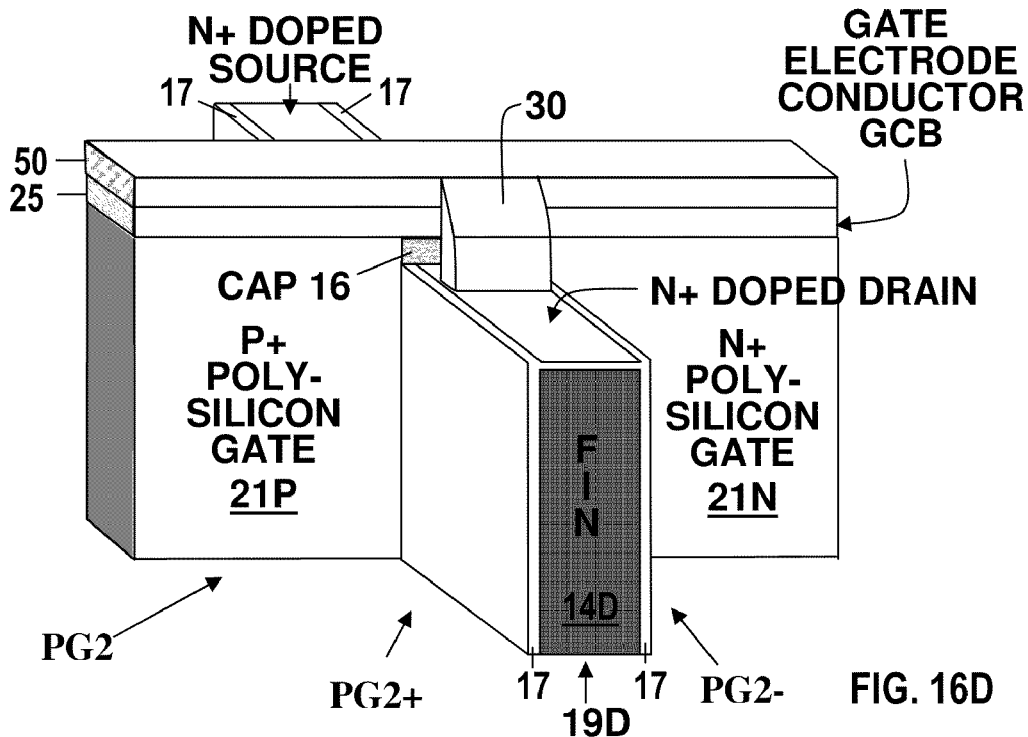

FIG. 16D is a perspective view of the bilateral pull-up transistor PG2 of FIGS. 15A and 15D formed on the fin 14D of fin stack 19D with a section of N+ doped drain and with a section of the P+ doped separate sidewall gate electrode in region 21P exposed. There are conventionally-doped separate sidewall gate electrode regions 21P shown on the left hand side of on the left hand sidewall of fin 14D of stack 19D and the counter-doped separate sidewall gate electrode region 21N shown on the left hand side of on the left hand sidewall of fin 14D stack 19D. As shown in FIG. 15D gate oxide layers 17 are formed on the sidewalls of the fin 14D of fin stack 19D, thereby separating the electrode regions 21N and 21P from the fin 14D. The silicon nitride cap 16 (a dielectric layer) is shown between the top surface of the fin 14D of fin stack 19D and the bottom surface of the doped polysilicon layer 25 of the gate conductor GCB. The silicide layer 50 is shown on top of the polysilicon layer 25 and aside from the channel is shown on the sidewalls and the top surface of the fin 14D of fin stack 19D. The gate conductor GCB is in electrical contact with the top surfaces of both of the separate gate electrode regions 21P and 21N. The bilateral transistors PG2+ and PG2− are formed to the left and the right of the fin 14D of fin stack 19D. The counter-doped-gate FinFET transistor PG2− is formed by the N+ doped source/drain regions, the channel therebetween and the P+ doped separate sidewall gate electrode region 21P on the left. The conventional-doped-gate FinFET transistor PU2+ is formed by the N+ doped source/drain regions, the channel therebetween and the separate sidewall gate electrode region 21N on the right.

Figure 16E:
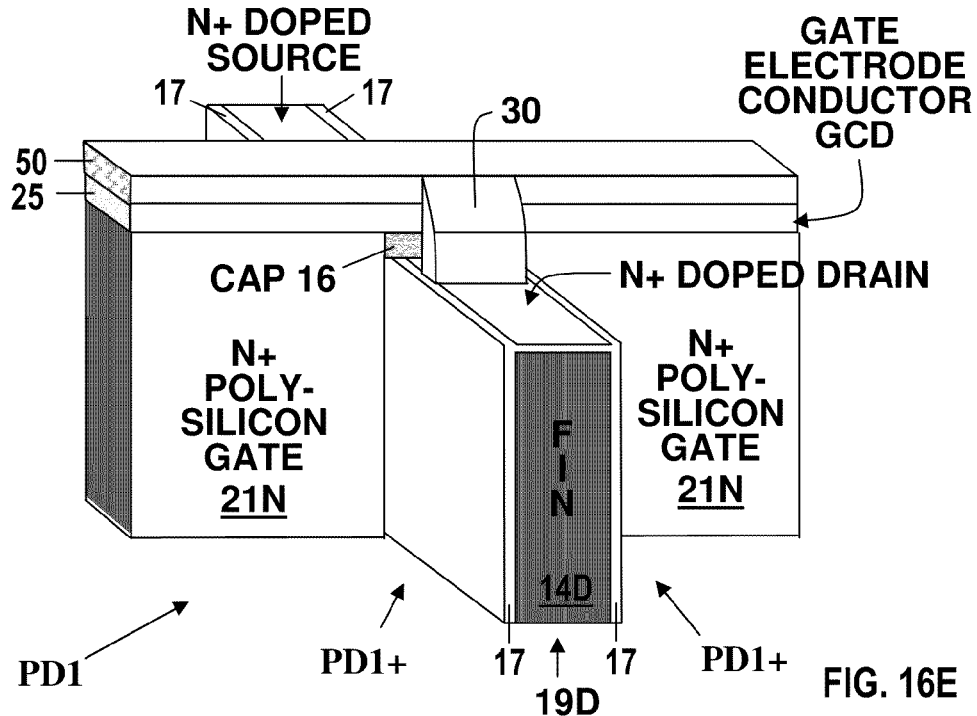

FIG. 16E is a perspective view of the bilateral pull-up transistor PD1 of FIGS. 15A and 15C formed on the fin 14D of fin stack 19D with a section of N+ doped drain and with a section of the N+ doped separate sidewall gate electrode region 21N exposed. The conventionally-doped separate sidewall gate electrode regions 21N are shown to the left and right of the fin 14D of fin stack 19D. As shown in FIG. 15C gate oxide layers 17 are formed on the sidewalls of the fin 14D of fin stack 19D, thereby separating the separate sidewall electrode regions 21N from the fin 14. The silicon nitride cap 16 (a dielectric layer) is shown between the top surface of the fin 14D of fin stack 19D and the bottom surface of the doped polysilicon layer 25 of the gate conductor GCD. The silicide layer 50 is shown on top of the polysilicon layer 25 and aside from the channel is shown on the sidewalls and the top surface of the fin 14D of fin stack 19D. The gate conductor GCD is in electrical contact with the top surfaces of both of the separate sidewall gate electrode regions 21N. The bilateral transistors PD1+ are formed to the left and the right of the fin 14D of fin stack 19D.

Figure 16F:
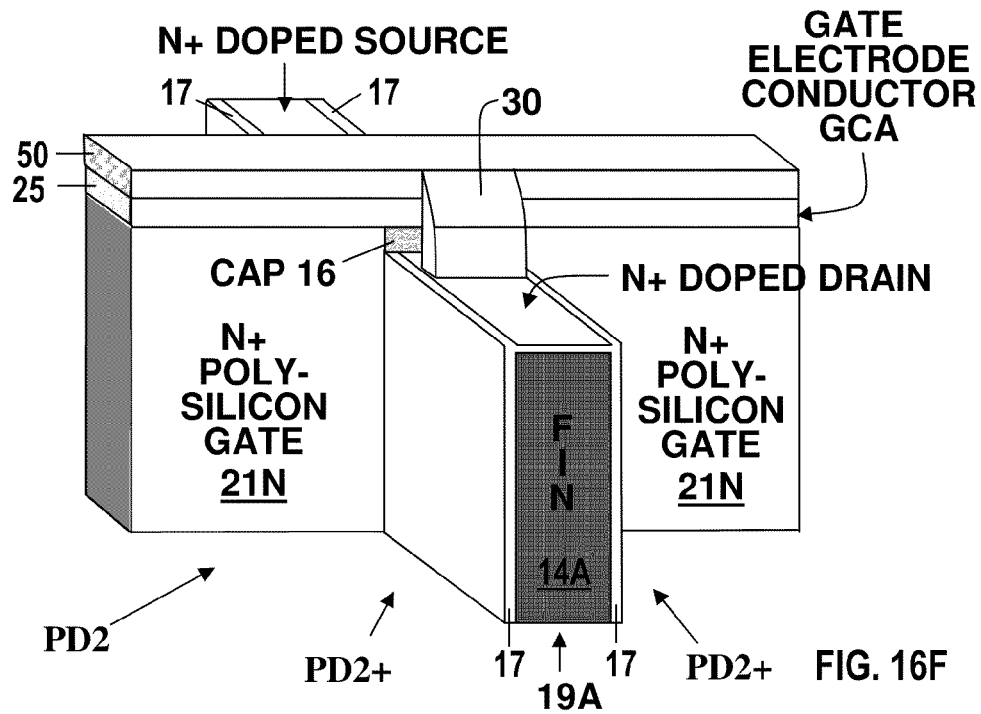

FIG. 16F is a perspective view of the bilateral pull-up transistor PD2 of FIGS. 15A and 15D formed on the fin 14A of fin stack 19A with a section of N+ doped drain and with a section of the N+ doped separate sidewall gate electrode region 21N exposed. The conventionally-doped separate sidewall gate electrode regions 21N are shown to the left and right of the fin 14A of fin stack 19A. As shown in FIG. 15D gate oxide layers 17 are formed on the sidewalls of the fin 14A of fin stack 19A, thereby separating the separate sidewall electrode regions 21N and 21P from the fin 14A. The silicon nitride cap 16 (a dielectric layer) is shown between the top surface of the fin 14A of fin stack 19A and the bottom surface of the doped polysilicon layer 25 of the gate conductor GCA. The silicide layer 50 is shown on top of the polysilicon layer 25 and aside from the channel is shown on the sidewalls and the top surface of the fin 14A of fin stack 19A. The gate conductor GCA is in electrical contact with the top surfaces of both of the separate sidewall gate electrode regions 21N. The bilateral transistors PD2+ are formed to the left and the right of the fin 14A of fin stack 19A.

When the gate electrode of an n-channel transistor is counter-doped with P type doping, the threshold voltage (Vt) is increased because of the gate region work function shift, and hence there is a lower drive current. The Vt can become so high that the transistor does not even turn on at a certain operation voltage. Thus it is possible to achieve a desired beta ratio (i.e., drive current ratio between two transistors) to achieve optimum circuit operation conditions, without changing the layout of the transistor. The same is true for a p-channel transistor doped with N-type doping of the gate electrode.

Similarly, when the gate electrode of a p-channel transistor is counter-doped with N type doping, the threshold voltage (Vt) is increased because of the gate region work function shift, and hence there is a lower drive current. The Vt can become so high that the transistor does not even turn on at a certain operation voltage. Thus it is possible to achieve a desired beta ratio (i.e., drive current ratio between two transistors) to achieve optimum circuit operation conditions, without changing the layout of the transistor.

In the embodiment of this invention, there are dual bilateral transistors formed on opposite sides of a fin of a FinFET SRAM with the transistor on one side comprising a p-channel transistor is doped with a gate electrode n type doping and on the other side of the fin, there is a p-channel transistor is doped with p type doping.

It is not necessary to provide transistors with oppositely doped bilateral gate electrodes for pass gate, pull down and/or pull up transistors at the same time. It may be possible to just make one of the three types of transistors with oppositely doped bilateral gate electrodes as described above, while the remainder of the transistors may be conventional, i.e. without counterdoping of gate electrodes. Specifically, we want to make pass gate asymmetric to achieve desired beta ratio. Also, for an SRAM, it is not necessary to make all transistors asymmetric.

Figure 17:
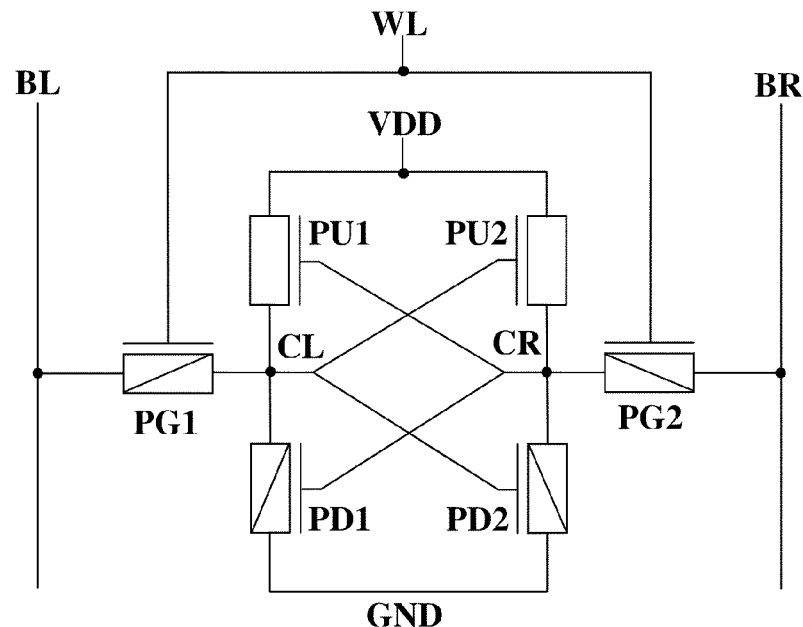
FIG. 17 is a schematic circuit diagram of the 6T SRAM of FIGS. 15A-15D.

FIG. 17 is a schematic circuit diagram of the 6T SRAM of FIGS. 15A-15D. As is conventional, the CMOS SRAM 10 cell of FIG. 17 consists of six transistors including two pull-up PFETs PU1 and PU2, two pull-down NFETs PD1 and PD2, and two pass gate NFETs PG1 and PG2 for input/output access. The pull-up PFET PU1 and pull down NFET PD1 form an inverter with common drains thereof interconnected to node CL with the node CL cross-coupled to the gate electrodes of the pull-up PFET PU2 and pull down NFET PD2. Another inverter consists of pull-up PFET PU2 and pull down NFET PD2 with drains thereof interconnected to node CL with the node CR cross-coupled to the gate electrodes of the pull-up PFET PU1 and pull-down NFET PD1. The pass gate NFETs PG1 and PG2 are the pass gate access devices which control reading from and writing into the cell 10. A word line WL is connected to the gate electrodes of both of the pass gate NFETs PG1 and PG2. The drain of pass gate NFET PG1 is connected to node CL. The drain of pass gate NFET PG2 is connected to node CR. The bit line BL is connected to the source of the pass gate NFETs PG1 and the bit line BR is connected to the source of the pass gate NFET PG2. The reference potential GND line is connected to the sources of the two pull-down NFETs PD1 and PD2. The Vdd line is connected to the sources of the two pull-up PFETs PU1 and PU2.

A corresponding prior art layout for 6T SRAM with NFET pass gate devices is shown in FIG. 1B and a layout for 6T SRAM with NFET pass gate devices is shown FIG. 2B of commonly assigned U.S. Pat. No. 6,341,083 and of Wong, entitled "CMOS SRAM Cell with PFET Passgate Devices," and FIG. 3 of commonly assigned U.S. Pat. No. 6,934,182 of Chan et al. entitled "Method to Improve Cache Capacity of SOI and Bulk" which are incorporated herein by reference illustrating in plan views the structure of such SRAM devices, as will be well understood by those skilled in the art.

SUMMARY

In a SRAM cell consisting of 6 FinFETs, as shown in FIG. 15C, only the pull-down nFinFET PD1 has the n-type separate sidewall gate electrode regions 21N on both sides of the fins under the polysilicon gate electrode of the FinFet stack 19D and as shown in FIG. 15D, only the pull-down nFinFET PD2 has the separate n-type gate electrode regions 21N on both sides of the polysilicon gate of the FinFet stack 19A. For both the nFinFET pass gate transistor PG1 and the pFinFET pull up transistor PU1, the fins 14A and 14C respectively under the polysilicon gates thereof have one side with n-type doping and the other side with p-type doping. Similarly, as shown in FIG 15D, for both the nFinFET pass gate transistor PG2 and the pFinFET pull up transistor PU2, the fins 14D and 14B respectively under the polysilicon gate electrodes thereof have one side with n-type doping and the other side with p-type doping. This way one can achieve desirable current ratios for this 6T SRAM cell.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

Having thus described the invention, what is claimed as new and desirable to be secured by Letter Patent is as follows:

1. A finFET (fin Field Effect Transistor) transistor SRAM device including finFET transistors comprising:
   at least a first vertical fin and a second vertical fin formed on a substrate with each of said first and second vertical fins being of uniform height and of uniform width from one end to the other thereof and having bilateral sidewalls on opposite sides thereof with gate dielectric layers formed covering said bilateral sidewalls and a dielectric layer formed thereabove;
   said first fin including a first transistor with a first channel region juxtaposed with a first source region and a first drain region and a second transistor with a second channel region and a second source region and a second drain region; a first set of bilateral doped separate sidewall gate electrodes formed covering said gate dielectric layers proximate to said first channel region between said first source and drain regions on opposite sides of said first fin and said first channel region, with the type of doping of the gate electrodes matching the type of doping of said first source and drain regions; and
   said second fin including a third channel region juxtaposed with a third source region and a third drain region; a second set of bilateral doped separate sidewall gate electrodes formed covering said gate dielectric layers proximate to said third channel region between said third source and drain regions on opposite sides of said second fin and said first channel region, with the type of doping one of said second set of bilateral doped separate sidewall gate electrodes being counterdoped with respect to the type of doping of said second source and drain regions.

2. The device of claim 1 wherein said fins have flat tops and have substantially equal heights.

3. The device of claim 1 wherein said finFET transistors are connected in an SRAM circuit.

4. The device of claim 1 wherein said finFET transistors are connected in a six transistor SRAM circuit.

5. The device of claim 1 wherein said finFET transistors are connected in a six transistor SRAM circuit including two PFET pull-up transistors, two NFET pull down transistors and two NFET passgate transistors.

6. A transistor finFET (fin Field Effect Transistor) Static Random Access Memory (SRAM) transistor device including finFET transistors comprising:
   said finFET SRAM including six finFET transistors each formed on one of an array of four fins with each of said six finFET transistors formed on said fins;

each of said fins including a semiconductor channel region plus a source region and a drain region extending within said fins from opposite sides of said channel region;

each of said fins being of uniform height and of uniform width from one end to the other thereof and having sidewalls;

gate dielectric layers formed over outer surfaces of each said channel region;

bilateral transistors with separate sidewall gate electrode regions extending from said gate dielectric layers and said sidewalls of each of said fins adjacent to said channel regions;

said finFET transistors including a first pair of said six transistors as pass gate finFET transistors formed on separate ones of a first pair of said fins and a second pair of said six transistors as pull up FinFET transistors formed on separate ones of a second pair of said fins with each of said pass gate and said pull up FinFET transistors comprising asymmetrically doped gate electrodes with said pull up and pass gate FinFET transistors having source and drain regions doped with a first type of dopant in said first pair of said fins and each having one sidewall gate electrode formed on one side of said fin doped with a first type of dopant and another sidewall gate electrode on an opposite side of said fin doped with an opposite type of dopant; and a third pair of said six transistors as said bilateral FinFET transistors comprising pull down FinFET transistors formed on separate ones of said first pair of pull down fins doped with a given type of dopant and symmetrically doped separate sidewall gate electrodes doped with a type of dopant matching said pull down fins.

7. The device of claim 6 wherein said fins have flat tops and have substantially equal heights.

8. The device of claim 6 wherein said finFET transistors are connected in a six transistor SRAM circuit.

9. The device of claim 7 wherein said finFET transistors are connected in a six transistor SRAM circuit.

10. The device of claim 6 wherein said finFET transistors are connected in a six transistor SRAM circuit including said pull-up FinFET transistors as PFETs, said pull down FinFET transistors as NFETs and said passgate FinFET transistors as NFETs.

11. A method of forming a finFET (fin Field Effect Transistor) Static Random Access Memory (SRAM) transistor device comprising:

forming said finFET SRAM including six transistors on an array of vertical fins being of uniform height and of uniform width from one end to the other thereof and with each of said transistors including within one of said fins a doped semiconductor channel region plus a source region and a drain region extending on opposite sides of said channel region;

forming a dielectric layer on top of each of said fins;

forming gate dielectric layers over each of said channel regions on sidewalls of said fins;

forming separate sidewall bilateral transistor gate electrode regions extending from said gate dielectric layer and said sidewalls of said fins adjacent to said channel regions;

forming gate conductors on top of each of said fins on top of said dielectric layer connecting to said separate sidewall gate electrode regions in an SRAM circuit;

forming at least one of said six transistors as an asymmetrically doped finFET transistor on a given fin having source and drain regions doped with a first type of dopant, with said asymmetrically doped finFET transistor including at least one of said separate sidewall bilateral transistor gate electrode regions on one side of said given fin counterdoped with respect to said dopant of said source and drain regions of said asymmetrically doped finFET transistors;

forming a first pair of said six transistors as pass gate finFET transistors on separate ones of a first pair of said fins and forming a second pair of said six transistors as pull up FinFET transistors formed on separate ones of a second pair of said fins with each of said pass gate and said pull up FinFET transistors comprising asymmetrically doped gate electrodes with said pull up and pass gate FinFET transistors having source and drain regions doped with a first type of dopant in a said fin and each having one sidewall gate electrode formed on one side of said fin doped with a first type of dopant and another sidewall gate electrode on an opposite side of said fin doped with an opposite type of dopant; and forming a third pair of said six transistors as finFET transistors comprising pull down finFET transistors on separate ones of said first pair of fins doped with a given type of dopant and symmetrically doped separate sidewall gate electrodes doped with a type dopant matching said pull down fins.

12. The device of claim 1 wherein said fins have flat tops and have substantially equal heights.

13. The method of claim 11 wherein said finFET transistors are connected in a six transistor SRAM circuit.

14. The method of claim 12 wherein said finFET transistors are connected in a six transistor SRAM circuit.

15. The device of claim 11 wherein said finFET transistors are connected in a six transistor SRAM circuit including said pull-up finFET transistors as PFETs, said pull down finFET transistors as NFETs, and said passgate finFET transistors as NFETs.

* * * * *